US007416978B2

(12) United States Patent
Hasebe et al.

(10) Patent No.: US 7,416,978 B2
(45) Date of Patent: Aug. 26, 2008

(54) FILM FORMING METHOD, FILM FORMING SYSTEM AND RECORDING MEDIUM

(75) Inventors: Kazuhide Hasebe, Tokyo-To (JP); Mitsuhiro Okada, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 333 days.

(21) Appl. No.: 11/296,852

(22) Filed: Dec. 8, 2005

(65) Prior Publication Data

US 2006/0141782 A1 Jun. 29, 2006

(30) Foreign Application Priority Data

| Dec. 9, 2004 | (JP) | ............................. 2004-356529 |
| Nov. 4, 2005 | (JP) | ............................. 2005-321167 |

(51) Int. Cl.
*H01L 21/44* (2006.01)

(52) U.S. Cl. ................................. 438/680; 257/E21.17
(58) Field of Classification Search ................. 438/680; 134/31
See application file for complete search history.

(56) References Cited

U.S. PATENT DOCUMENTS

| 5,405,444 | A  | * | 4/1995  | Moslehi ...................... 118/725 |
| 6,325,948 | B1 | * | 12/2001 | Chen et al. .................... 216/67 |
| 6,573,178 | B1 |   | 6/2003  | Nakamura |
| 6,579,361 | B2 | * | 6/2003  | Preti .......................... 117/200 |
| 2003/0224615 | A1 | * | 12/2003 | Nishino et al. .............. 438/758 |

FOREIGN PATENT DOCUMENTS

| JP | 5-97579     | 4/1993  |
| JP | 7-106272    | 4/1995  |
| JP | 10-313724   | 12/1998 |
| JP | 2000-306904 | 11/2000 |
| JP | 2003-209058 | 7/2003  |
| JP | 2004-104029 | 4/2004  |

OTHER PUBLICATIONS

JPO Office Action dated Mar. 25, 2008.

* cited by examiner

*Primary Examiner*—Alexander G Ghyka
(74) *Attorney, Agent, or Firm*—Smith, Gambrell & Russell, LLP

(57) ABSTRACT

After silicon nitride films have been formed on wafers by a film forming process in a reaction vessel, the reaction vessel is processed by a purging process specified by a purging recipe and compatible with the film forming process to suppress production of gases and particles by removing surface parts of films deposited on the inside surface of the reaction vessel and causative of production of gases and particles.

A wafer boat 25 holding a plurality of wafers W is loaded into a reaction vessel 2, and the wafers W are processed by a film forming process specified by a film forming recipe 1 specifying, for example, $Si_2Cl_2$ gas and $NH_3$ gas as film forming gases. Subsequently, a purging recipe 1 specifying a purging process compatible to the film forming process is selected automatically, and the reaction vessel 2 is processed by the purging process specified by the purging recipe 1. A purging recipe is selected automatically from a plurality of purging recipes specifying purging processes respectively compatible with film forming processes. Unnecessary extension of purging time is suppressed and the reaction vessel 2 can be processed by an appropriate purging process compatible with the film forming process.

9 Claims, 13 Drawing Sheets

| PROCESS RECIPES | FILM FORMING RECIPES | THRESHOLD CUMULATIVE THICKNESS A | PURGING RECIPES | |
|---|---|---|---|---|
| | | | BASIC | SPECIAL |
| 1 | 1 (DCS) | 1.5 μm | 1 | 4 |
| 2 | 2 (HCD, BELOW 500°C) | A1 : 1000 Å<br>A2 : 5000 Å | 2 | PURGING RECIPE 3 WHEN THE CUMULATIVE THICKNESS IS GREATER THAN A1<br>PURGING RECIPE 4 WHEN THE CUMULATIVE THICKNESS IS GREATER THAN A2 |
| 3 | 3 (HCD, 500°C OR ABOVE) | 5000 Å | 3 | 4 |
| 4 | 4 (BTBAS) | 3000 Å | 4 | — |

FIG. 7

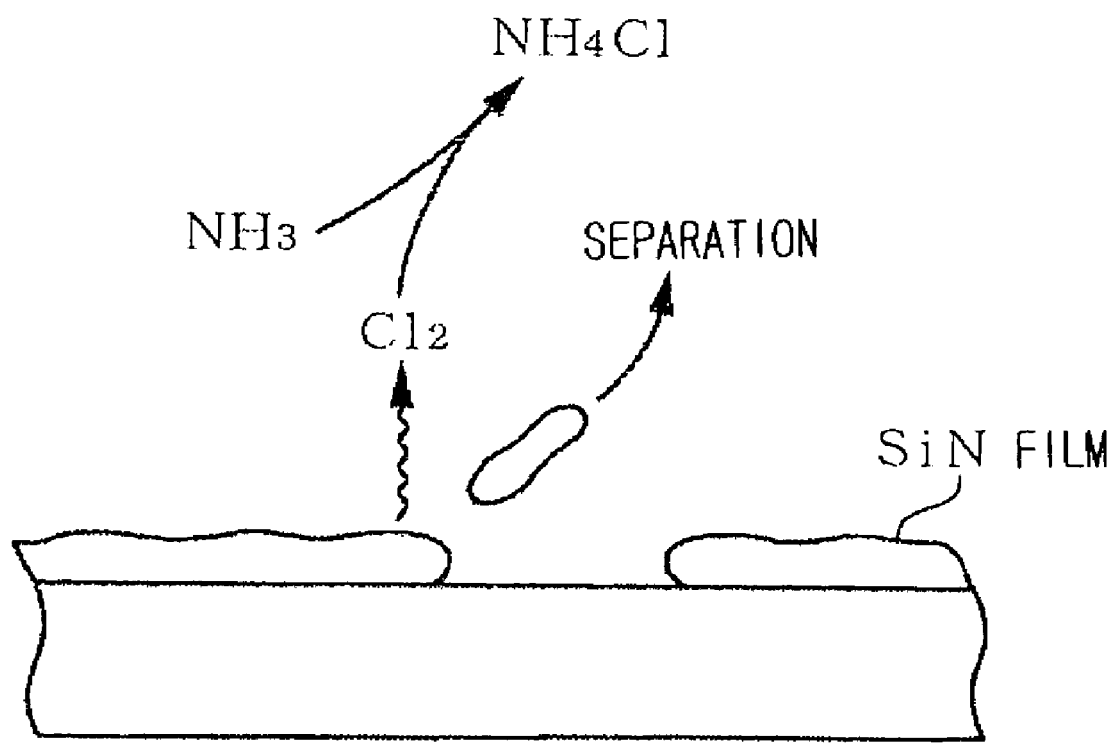
F I G. 13

FILM FORMING METHOD, FILM FORMING SYSTEM AND RECORDING MEDIUM

BACKGROUND OF THE INVENTION

1. Field of the Invention

The present invention relates to a film forming method including a purging process for purging a reaction vessel with a purging gas after completing a film forming process for forming, for example, a silicon nitride film on a surface of a substrate, a film forming system for carrying out the film forming method, and a recording medium storing programs to be executed by a computer to carry out the film forming method.

2. Description of the Related Art

A semiconductor device fabricating process includes a film forming process for forming a silicon nitride film, namely, a film of $Si_3N_4$ (hereinafter referred to as "SiN film") on a substrate, such as a semiconductor wafer (hereinafter, referred to as "wafer") W. The SiN film is formed on each of wafers W by a chemical vapor deposition method (CVD method) using a batch type thermal processing system. The SiN film is formed a surface of each of the wafers W by carrying a wafer holder holding the wafers W in layers into a vertical reaction vessel of quartz, keeping the interior of the reaction vessel at a predetermined pressure and supplying process gases for depositing the SiN film into the reaction vessel.

A main product and by-products of a film forming reaction deposit in films on the inside surface of the reaction vessel and the wafer holder after the thermal processing system has repeated the film forming process for forming the SiN film. The deposited films grow gradually as the number of cycles of the film forming process increases. After the thickness of the deposited films has increased to a predetermined thickness, the deposited films produce gases, the deposited films are cracked or the deposited films come off the surfaces in particles when the reaction vessel is heated for the next cycle of the film forming process.

To avoid such troubles, a cleaning gas is supplied into the reaction vessel to remove the deposited film deposited on the reaction vessel completely by the etching effect of the cleaning gas after the film forming process has been repeated by a predetermined number of cycles. If the reaction vessel is cleaned by etching after every cycle of the film forming process, the reaction vessel of quartz is deteriorated and it takes a considerably long time to remove the cleaning gas completely from the reaction vessel. Therefore, a purging process is executed after the completion of every cycle of the film forming process.

The purging process is carried out after the wafer holder holding the processed wafers W has been unloaded from the reaction vessel and before the wafer holder holding unprocessed wafers W is loaded into the reaction vessel. In the purging process, an empty wafer holder not holding any wafers W is carried into the reaction vessel, the interior of the reaction vessel is kept at a predetermined pressure and at a predetermined temperature, a purging gas, such as nitrogen gas ($N_2$) is supplied into the reaction vessel, the reaction vessel is cooled rapidly, is evacuated and heated to remove surface layers of the films adhering to the inner surface of the reaction vessel positively by the purging process to suppress the generation of gasses and the production of particles. The purging process thus removes the surface layers of the deposited films are about to come off the reaction vessel. Removal of the surface layers of the deposited film is effective in suppressing the production of gasses and particles in the film forming process to be executed subsequently to the purging process.

The purging process is controlled on the basis of a fixed purging recipe regardless of the type of the film forming process carried out in the reaction vessel and the thickness of the film formed of films successively deposited on the inside surface of the reaction vessel. Time necessary to complete the purging recipe is on the order of 50 min. The purging recipe is designed for the strongest purging process for removing a very thick deposited film or a film of the type that is difficult to remove. Therefore, the production of gases and particles from most deposited films can be suppressed without continuing the purging process for such a long time specified by the purging recipe and hence some part of the purging process is unnecessary. The time spent for the unnecessary part of the purging process is a downtime of the film forming system. Increase in the downtime decreases the throughput of the film forming system. The purging process includes the steps of cooling the interior of the reaction vessel at a predetermined temperature, heating the interior of the reaction vessel and evacuating the reaction vessel. Thus the unnecessary purging process increases the processing cost.

Such a problem may be solved by modifying the purging recipe for each cycle of the film forming process taking into consideration the estimated amount of particles that may be produced in the reaction vessel. However, much time is needed for the analysis of the causes of particle production and, consequently, time necessary for the purging process increases.

A technique for reducing the amount of particles adhering to the wafers W is proposed in Patent document 1. This previously proposed technique cracks the deposited films adhering to the inside surface of a reaction furnace by varying the temperature in the reaction furnace and makes a purging gas carry particles produced when the deposited films are cracked outside the reaction furnace. However, this previously proposed technique uses the same purging recipe regardless of the type of the film forming process and hence cannot solve the foregoing problem.

Patent document 1: JP 200-306904 A

SUMMARY OF THE INVENTION

The present invention has been made in view of such a circumstances and it is therefore an object of the present invention to provide a technique capable of achieving an efficient purging process and of suppressing the production of gases and particles in a film forming process subsequent to the purging process by automatically selecting a proper purging recipe from a plurality of previously prepared purging recipes on the basis of the thickness of a thin film formed by a selected film forming recipe and processing a reaction vessel by a purging process specified by the selected purging recipe.

A film forming method of processing substrates by a film forming process using film forming gases by a thermal processing system provided with a plurality of film forming recipes includes the steps of: processing substrates held on a substrate holder placed in a reaction vessel by a film forming process specified by a selected one of the film forming recipes; unloading the substrates from the reaction vessel; automatically selecting one of a plurality of previously prepared purging recipes on the basis of a cumulative thickness equal to the sum of thicknesses of thin films formed by cycles of the film forming process specified by the selected film forming recipe; and carrying out a purging process specified by the selected purging recipe to purge the reaction vessel by supplying a purging gas into the reaction vessel after the substrates have been unloaded from the reaction vessel.

The plurality of film forming recipes include those respectively specifying different film forming gases to form thin films of the same type, and those respectively specifying the same film forming gases and different process temperature ranges. The plurality of purging recipes include those differing from each other in at least either of purging time and temperature condition in the reaction vessel. Different temperature conditions in the reaction vessel are specified by different temperature profiles, namely, different patterns of temperature change with time.

The substrate holder holds a plurality of substrates in parallel layers, and the purging process includes a first purging process that is carried out in a state where the reaction vessel is sealed after the substrate holder has been unloaded from the reaction vessel. The substrate holder holds a plurality of substrates in parallel layers, and the purging process includes a second purging process that is carried out in a state where the empty substrate holder is placed in the sealed reaction vessel.

The film forming method according to the present invention may further include the step of changing the purging recipe on the basis of at least either of the measured number of particles in the reaction vessel and the measured number of particles adhering to the surfaces of the substrates. In the film forming method according to the present invention, the first and/or the second pursing process may include the step of forcibly cooling the reaction vessel and the second purging process may include the step of heating the reaction vessel at a temperature higher than a process temperature for a film forming process following the purging process.

A film forming system that forms films on substrates held on a substrate holder placed in a reaction vessel by a film forming process specified by a film forming recipe selected from a plurality of different film forming recipes and carries out a purging process by supplying a purging gas into the reaction vessel after the substrates have been unloaded from the reaction vessel includes: a storage unit storing a plurality of purging recipes respectively specifying different purging processes; managing means for managing a cumulative thickness equal to the sum of thicknesses of thin films formed by cycles of a film forming process specified by each of the film forming recipes; and a purging recipe selecting means for selecting a purging recipe from the plurality of purging recipes on the basis of the cumulative thickness equal to the sum of the thicknesses of thin films formed by a film forming process specified by the selected film forming recipe.

The plurality of film forming recipes include those respectively specifying different film forming gases for forming the same thin film and those respectively specifying different process temperature ranges and the same film forming gases. The plurality of purging recipes include those differing from each other in at least either process time for the purging process and temperature in the reaction vessel.

In the film forming system according to the present invention, the substrate holder holds a plurality of substrates in parallel layers, and the purging process may include a first purging process that is carried out in a state where the reaction vessel is sealed after the substrate holder has been unloaded from the reaction vessel. In the film forming system according to the present invention, the substrate holder holds a plurality of substrates in parallel layers, and the purging process may include a second purging process that is carried out in a state where the empty substrate holder is placed in the sealed reaction vessel.

A recording medium according to the present invention stores programs to be executed by a computer to carry out the film forming method according to the present invention. More concretely, the programs to be executed by the computer specifies the steps of: processing substrates held on a substrate holder placed in a reaction vessel by a film forming process on the basis of a selected film forming recipe; unloading the substrates from the reaction vessel; automatically selecting one of a plurality of previously prepared purging recipes on the basis of a cumulative thickness equal to the sum of thicknesses of thin films formed by the film forming process based on the selected film forming recipe; and carrying out a purging process by supplying a purging gas into the reaction vessel on the basis of the selected purging recipe. The cumulative thickness is the sum of the thicknesses of thin films formed since starting using a new reaction vessel or since resuming using the reaction vessel after cleaning the interior thereof. For example, the cumulative thickness is calculated by adding up desired film thicknesses respectively for film forming processes.

The present invention selects the purging recipe on the basis of the cumulative thickness equal to the sum of the thicknesses of thin films formed by a film forming process specified by the selected film forming recipe. The cumulative thickness is not necessarily for only each of the film forming recipes. According to the present invention, the cumulative thickness may be for a group of a plurality of film forming recipes, and the purging recipe may be selected on the basis of the cumulative thickness for the group of film forming recipes.

The recording medium is any one of flexible disks, compact disks and magnetooptical disks, namely, the so-called MO disks.

According to the present invention, the purging recipe is selected automatically from the plurality of previously prepared purging recipes on the basis of the cumulative thickness equal to the sum of thin films formed by a selected film forming recipe, and the reaction vessel is purged by a purging process specified by the selected purging recipe. Thus a proper purging process compatible with the film forming process is executed. Some film forming processes specified by some film forming recipes require a purging process specified by a purging recipe having a strong purging effect and some other film forming processes do not require a purging process specified by a purging recipe having a strong purging effect. The purging process having a strong purging effect takes a long process time. The proper purging process compatible with the film forming recipe reduces wasteful process time for the purging process, enables removing films deposited on the inside surface of the reaction vessel and being causative of the production of gases and particles, and can suppress the production gases and particles in the film forming process to be carried out subsequently to the purging process.

Consequently, the downtime for which the film forming system is inoperative is eliminated or reduced to the least possible extent, and the reduction of the through put of the film forming system due to the purging process can be suppressed.

BRIEF DESCRIPTION OF THE DRAWINGS

FIG. 7 is a table showing process recipes specifying processes to be carried out by the film forming system shown in FIG. 1;

FIG. 13 is a typical side elevation of assistance in explaining a peeling mode in which a SiN film deposited on the inside surface of a processing vessel comes off the inside surface of the processing vessel.

DESCRIPTION OF THE PREFERRED EMBODIMENTS

Figure 1:
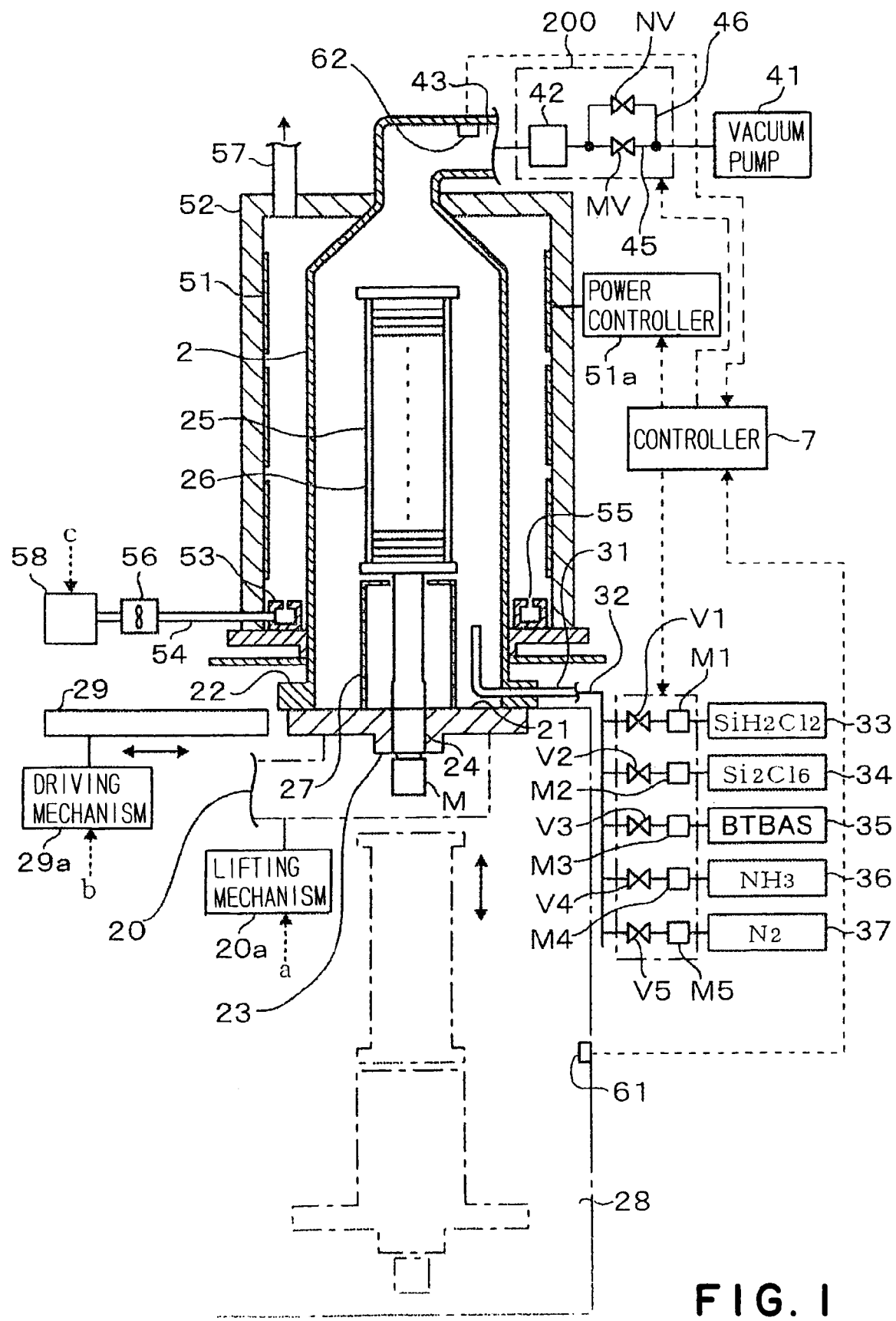
FIG. 1 is a longitudinal sectional view of a film forming system for carrying out a film forming method in a preferred embodiment according to the present invention.

First, a film forming system in a first embodiment according to the present invention for carrying out a film forming method according to the present invention will be described. In FIG. 1 showing a film forming system in a batch type low-pressure CVD system, indicated at 2 is a cylindrical, vertical reaction vessel made of, for example, quartz. The reaction vessel 2 has an open lower end 21 serving as a furnace opening. A flange 22 is formed integrally with the reaction vessel 2 around the open lower end 21. A first lid 23 made of, for example, quartz is dispose below the reaction vessel 2. The first lid 23 is moved vertically by a boat elevator 20 to bring the first lid 23 into close contact with the open lower end 21 to seal the reaction vessel 2 and to separate the first lid 23 from the open lower end 21 to open the reaction vessel 2. The boat elevator 20 is moved vertically by a lifting mechanism 20a. A rotating shaft 24 is extended vertically through a central part of the first lid 23. A wafer boat 25, namely, a substrate holder, is mounted on top of the rotating shaft 24.

The wafer boat 25 is provided with three or more upright support bars 26. In this embodiment, the wafer boat 25 is provided with four support bars 26. The support bars 26 are provided with slots to support, for example, one hundred and twenty-five wafers W, namely, workpieces, in a vertical arrangement on the wafer boat 25. Some dummy wafers are arranged in upper and lower end parts of a wafer holding range in which the wafers W are held and the wafers W to be processed are arranged in a middle part of the wafer holding range between the upper and the lower end part. A motor M for driving the rotating shaft 25 for rotation is disposed below the lower end of the rotating shaft 25. Thus the wafer boat 25 is rotated by the motor M. A heat insulating unit 27 is mounted on the first lid 23 so as to surround the rotating shaft 24.

The boat elevator 20 moves the wafer boat 25 vertically between a processing position in the reaction vessel 2 and a loading position in a loading area 28 where the wafers W are loaded into and unloaded from the wafer boat 25. When the boat elevator 20 positions the wafer boat 25 at the processing position, the first lid 23 closes the open lower end 21 of the reaction vessel 2. A second lid 29 made of, for example, quartz is disposed below the reaction vessel 2. The second lid 29 can be horizontally moved by a driving mechanism 29a. When the first lid 29 is held in the loading area 28 and the open lower end 21 is opened, the second lid 29 covers the open lower end 21 of the reaction vessel 2 closely to seal the reaction vessel 2.

An L-shaped injector 31 is passed through a hole formed in the flange 22 of the reaction vessel 2 into the reaction vessel 2 to supply a gas into the reaction vessel 2 holding the wafers W therein. A gas supply pipe 32, namely, a gas supply line, has one end connected to a base end of the injector 31 and the other end connected through a gas supply control unit 100 to, for example, four film forming gas sources 33, 34, 35 and 36 and a purging gas source 37. The film forming gas needed for film formation is injected by the injector 31 into the reaction vessel 2. The gas supply control unit 100 has flow control devices including valves V1 to V5 and flow regulators M1 to M5.

In this embodiment, the film forming gas sources 33, 34, 35 and 36 supply $SiH_2Cl_2$ gas (dichlorosilane gas, abbreviated to DCS gas), $Si_2Cl_6$ gas (HCD gas), bis-tertiary butyl aminosilane gas (BTBAS gas) and ammonia gas ($NH_3$ gas), respectively. The purging gas source supplies an inert gas, such as nitrogen gas ($N_2$). The purging gas is not limited to an inert gas.

A discharge opening for discharging gases from the reaction vessel 2 is formed in an upper part of the reaction vessel 2. A discharge pipe 43 is connected to the discharge opening. A vacuum pump 41, namely, an evacuating means, for evacuating the reaction vessel 2 to create a desired vacuum in the reaction vessel 2, and a pressure regulator 42, such as a butterfly valve, are placed in the discharge pipe 43. A main line 45 provided with a main valve MV, and a by-pass line 46 provided, for example, a needle valve NV and connected in parallel to the main line 45 are placed in a part of the discharge pipe 43 between the vacuum pump 41 and the pressure regulator 42. The main valve MV is closed and the needle valve NV is opened to discharge gases from the reaction vessel 2 through the by-pass line 46 at a low discharge rate of, for example, about 30 l/min. Both the main valve MV and the needle valve NV are opened to evacuate the reaction vessel 2 through both the main line 45 and the by-pass line 46. A discharge control unit 200 is represented by an area surrounded by chain lines in FIG. 1.

The reaction vessel 2 is placed in a heating furnace 52. The heating furnace 52 is provided with a heater 51, namely, a heating means, for heating the interior of the reaction vessel 2. Preferably, the heater 51 includes a carbon wire or the like. The carbon wire does not cause contamination and has an excellent heating characteristic. A power controller 51a controls the power supplied to the heater 51. An annular air supply duct 53 is disposed in an annular space between the reaction vessel 2 and the heating furnace 52 so as to surround a lower part of the reaction vessel 2. The air supply duct 53 is provided in its upper wall with a plurality of outlets 55. An air supply pipe 54 for carrying cooling air cooled at a temperature on the order of 0° C. is connected to the air supply duct 53. Cooled air is supplied through the air supply pipe 54 and the air supply duct 53 for forced cooling. Shown also in FIG. 1 are a fan 56 for blowing air into the air supply duct 53, a discharge line 57 and an air supply system 58 including a valve and a flow regulator.

The film forming system is provided with a first particle detector 61, placed in the loading area 28, and a second particle detector 62 placed in the discharge pipe 43. The first particle detector 61 and the second particle detector 62 give detection signals to a controller. The first particle detector 61 is a particle counter for counting particles on the surfaces of wafers held outside or inside the film forming system. The second particle detector 62 is a particle counter for counting particles in a gas phase prevailing in the reaction vessel 2 or a discharge system including the discharge pipe 43.

Figure 2:
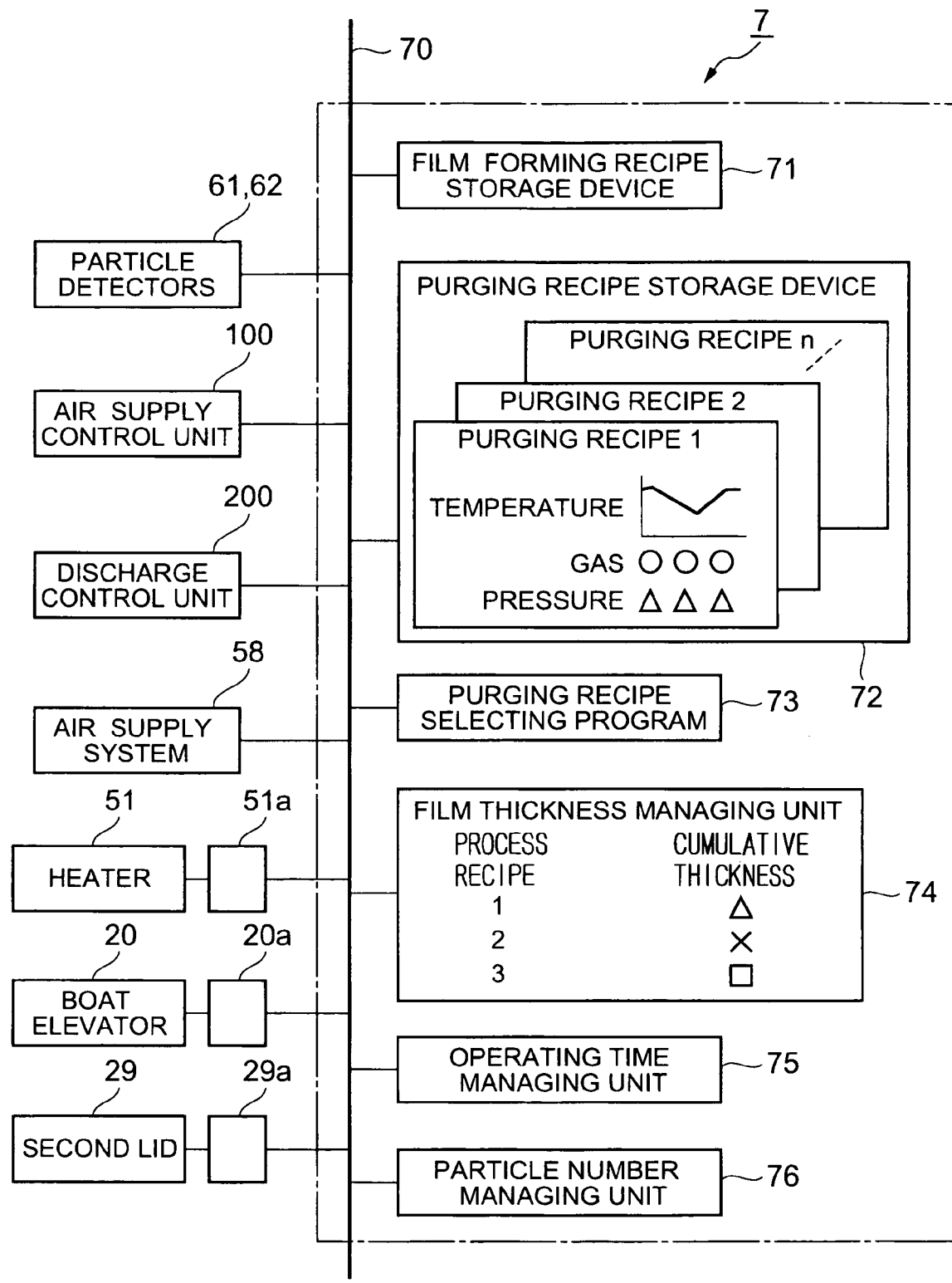
FIG. 2 is a block diagram of a control unit included in the film forming system shown in FIG. 1.

The film forming system is provided with a controller 7 including a computer. The controller 7 controls the operations of the lifting mechanism 20a of the boat elevator 20, the driving mechanism 29a for driving the second lid 29, the power controller 51a for controlling the power supplied to the heater 51, the gas supply control unit 100, the discharge control unit 200 and the air supply system 58. Actually, the controller 7 includes a CPU (central processing unit), programs stored in a storage device and storage devices. FIG. 2 shows the controller 7 in a block diagram. The present invention is featured by a purging process for purging the reaction vessel 2 of the film forming system and hence priority will be given to the explanation of components related with the purging process.

Referring to FIG. 2, connected to a bus 70 are a film forming recipe storage device 71, a purging recipe storage device 72, a purging recipe selecting program storage device 73, a film thickness managing unit 74, an operating time managing unit 75 for managing the operating time of the reaction vessel 2, a particle number managing unit 76, the first particle detector 61, the second particle detector 62, the air supply control unit 100, the discharge control unit 200, the air supply system 58, the power control unit 51a for controlling power supplied to the heater 51, the lifting mechanism 20a of the boat elevator 20 and the driving mechanism 29a for driving the second lid 29.

The film forming recipe storage device 71 stores a plurality of film forming recipes including those for forming the same thin film respectively using different film forming gases and those for forming the same film using the same film forming gas and respectively using process temperatures in different temperature ranges.

This embodiment prepares four recipes, namely, a film forming recipe 1, a film forming recipe 2, a film forming recipe 3 and a film forming recipe 4. The film forming recipe 1 specifies DCS gas as the film forming gas. The film forming recipe 2 specifies HCD gas as the film forming gas and a process temperature below 500° C. The film forming recipe 3 specifies HCD gas as the film forming gas and process temperatures not lower than 500° C. The film forming recipe 4 specifies BTBAS gas as the film forming gas.

The purging recipe storage device 72, namely, the storage device, stores a plurality of purging recipes. The purging recipes describe conditions for purging processes. The purging process is carried out in a period between successive film forming processes to purge the reaction vessel with a purging gas. The plurality of purging recipes include those specifying different values for at least either of the process time of the purging process and temperature of the interior of the reaction vessel. Difference in the temperature of the interior of the reaction vessel signifies difference in temperature profile representing the variation of set temperature with time.

FIGS. 3, 4, 5 and 6 shows purging recipes 1, 2, 3 and 4 respectively corresponding to the film forming recipes 1, 2, 3 and 4, respectively, by way of example.

The purging recipe selecting program 73 is a purging recipe selecting means for selecting one of the plurality of purging recipes on the basis of a cumulative thickness equal to the sum of the thicknesses of thin films formed by cycles of a film forming process specified by a selected film forming recipe. More concretely, a predetermined purging recipe is selected from the plurality of previously prepared purging recipes on the basis of the film forming recipe and the cumulative thickness. FIGS. 8 to 11 show flow charts of purging recipe selecting procedures for selecting the purging recipes to be used respectively in combination with the selected film forming recipes, respectively. A predetermined purging recipe is selected by the purging recipe selecting procedure. FIG. 7 is a table for facilitating understanding the relation between the film forming recipes and the purging recipes.

The film thickness managing unit 74 obtains the cumulative thickness equal to the sum of the thicknesses of thin films formed by the selected film forming recipe. The cumulative thickness is the sum of the thicknesses of thin films formed since starting using a new reaction vessel or since resuming using the reaction vessel after cleaning the interior thereof. For example, the cumulative thickness is calculated by adding up desired film thicknesses respectively for film forming processes.

The operating time managing unit 75 calculates a cumulative operating time for which the reaction vessel 2 has been operated for cycles of a film forming process specified by the film forming recipe. The operating time is a time between a moment the open lower end of the reaction vessel 2 is closed by the first lid 23 after the wafer boat 25 holding unprocessed wafer W has been loaded into the reaction vessel 2 and a moment the open lower end of the reaction vessel 2 is closed by the second lid 29 after the wafer boat 25 holding the processed wafers W has been unloaded from the reaction vessel 2.

The particle number managing unit 76 receives data on the measured numbers of particles from the first particle detector 61 and a second particle detector 62. The particle number managing unit 76 provides an abnormal particle production signal at a predetermined time when the mode of production of particles changes, for example, when the mean particle number is doubled or tripled.

The software stored in the controller 7, namely, the process programs, the film forming recipes, purging recipes and graphic data for entering the film forming recipes and particle recipes, is recorded in a recording medium, such as a flexible disk, a compact disk, a magnetooptical disk, namely, the so-called MO disk, installed in the controller 7. The process programs are computer programs specifying operations to be carried out by the film forming system. The purging recipe selecting program is one of the process programs.

Figure 8:
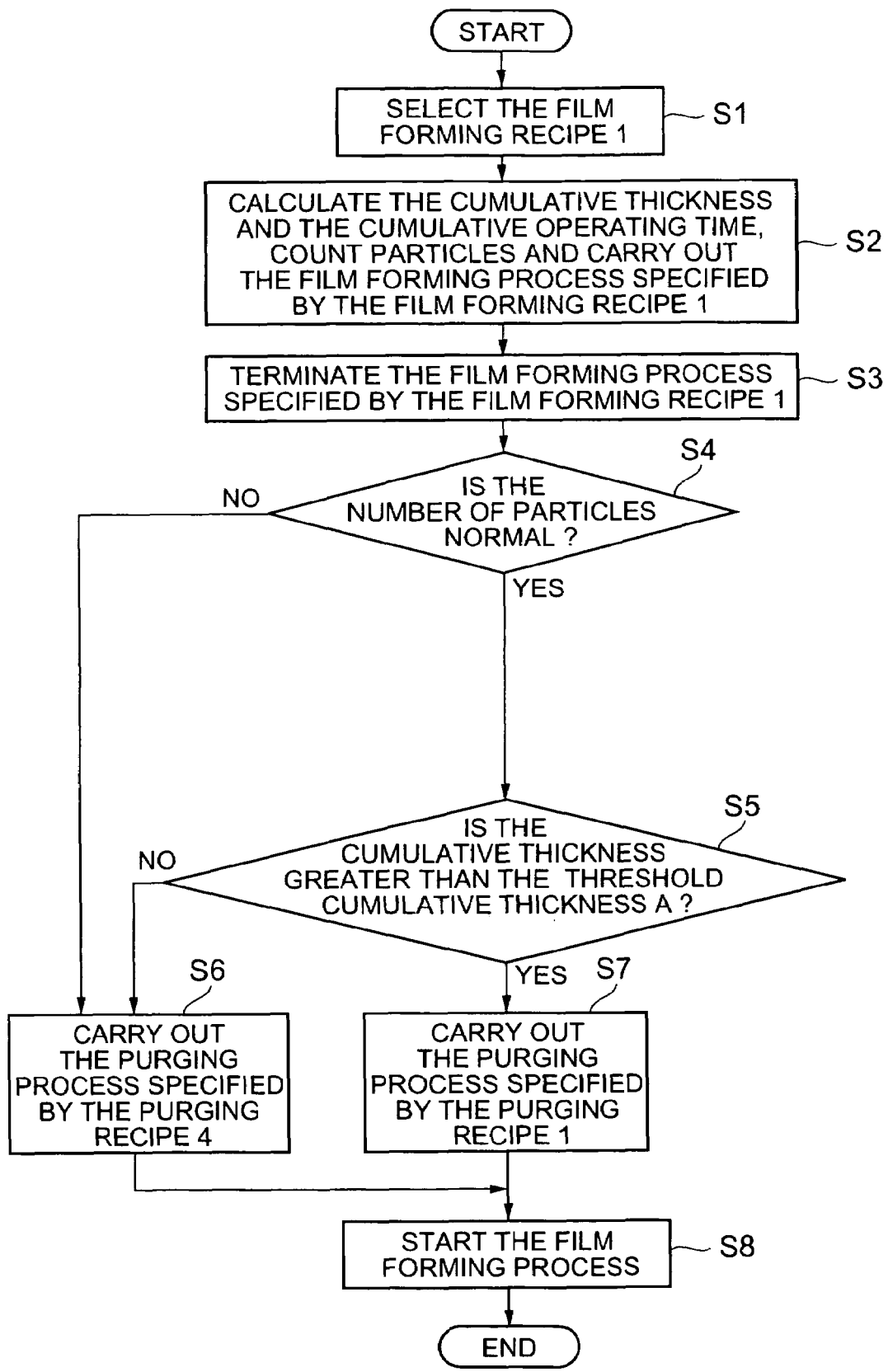
FIG. 8 is a flow chart of a process recipe 1 specifying conditions for a first process to be executed by the film forming system shown in FIG. 1.

A film forming method to be carried out by the film forming system will be described by way of example. The film forming method will be described with reference to a flow chart shown in FIG. 8 on an assumption that DCS gas is used as the film forming gas for forming a SiN film. Execution of steps of the procedure represented by the flow chart shown in FIG. 8 is controlled by the computer program. The film forming recipe 1 is selected in step SI. The cumulative thickness and the cumulative operating time for which the reaction vessel 2 has been used are calculated, particles are counted and the film forming process specified by the film forming recipe 1 is carried out in step S2. A predetermined number of wafers W are mounted on the wafer boat 25 and the wafer boat 25 is loaded into the reaction vessel 2 by lifting up the first lid 23 by the boat elevator 20.

After the wafer boat 25 has been loaded into the reaction vessel 2 and the open lower end 21 of the reaction vessel 2 has been closed by the first lid 23, the interior of the reaction vessel 2 is heated at a temperature in the range of, for example, 650° C. to 760° C., the main valve MV and the needle valve NV are opened and the vacuum pump 41 is operated to evacuate the reaction vessel 2 to a predetermined vacuum of, for example, 0.4 Pa.

Then, DCS gas and $NH_3$ gas are supplied from the first film forming gas source 33 and the second film forming gas source 34 at predetermined flow rates, respectively, into the reaction vessel 2 to carry out the film forming process for forming a SiN film. The DCS gas and the $NH_3$ gas supplied into the reaction vessel 2 are decomposed by thermal decomposition and a SiN film is deposited on the surface of each wafer W. During those steps of the film forming process, the motor M rotates the wafer boat 25. The supply of DCS gas and $NH_3$ gas is stopped, the atmosphere in the reaction vessel is discharged from the reaction vessel 2, $N_2$, namely, a purging gas, is supplied for purging from the purging gas source 37 into the reaction vessel 2. After the reaction vessel 2 has been thus purged of the atmosphere, the pressure of the interior of the reaction vessel 2 is adjusted to the atmospheric pressure. Then, the wafer boat 25 is unloaded from the reaction vessel 2 and the film forming process specified by the film forming recipe 1 is terminated in step S3.

Subsequently, the purging process is carried out. First the purging recipe is selected. A query is made in step S4 to see if the particle number managing unit 76 decided that the number of particles is normal. If the number of particles is normal, the film forming method goes to step S5. If the number of particles is abnormal the purging process specified by the purging recipe 4 is executed in step S6.

A query is made in step S5 to see if the cumulative thickness calculated by the film thickness managing unit 74 is greater than a threshold cumulative thickness A of, for example, 1.5 μm. If the response to the query in step S5 is negative, the purging process specified by the purging recipe 1 is carried out in step S7. If the response to the query in step S5 is affirmative, the purging process specified by the purging recipe 4 is carried out in step S6. After the purging process specified by the selected purging recipe has been completed, the wafer boat 25 holding unprocessed wafers W is loaded into the reaction vessel 2 and then the next cycle of the film forming process is started in step S8.

Figure 9:
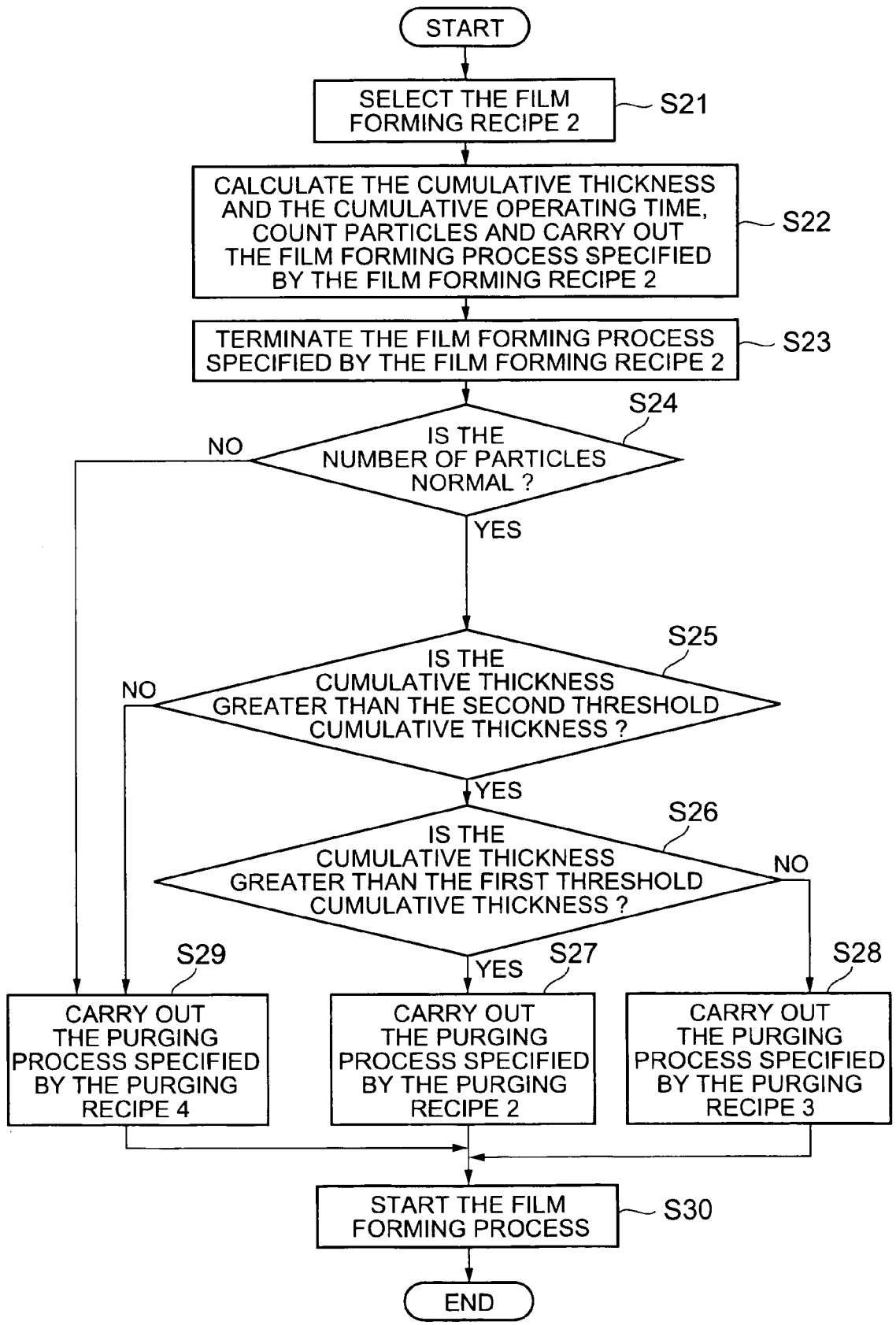
FIG. 9 is a flow chart of a process recipe 2 specifying conditions for a second process to be executed by the film forming system shown in FIG. 1.

The film forming method will be described with reference to a flow chart shown in FIG. 9 on an assumption that HCD gas is used as the film forming gas for forming a SiN film at a process temperature below 500° C. The film forming recipe 2 is selected in step S21. The cumulative thickness and the cumulative operating time for which the reaction vessel 2 has been used are calculated, particles are counted and the film forming process specified by the film forming recipe 2 is carried out in step S22. HCD gas and $NH_3$ gas are used as film forming gases, the interior of the reaction vessel 2 is heated at a temperature not lower than 450° C. and below 500° C. The film forming process specified by the film forming recipe 2 is terminated in step S23.

Subsequently a purging process is started. A query is made in step S24 to see if the number of particles is normal. Step S25 is executed if the response to the query in step S24 is affirmative. Step S29 is executed to carry out the purging process specified by the purging recipe 4 if the response to the query in step S24 is negative.

A query is made in step S25 to see if the cumulative thickness calculated by the film thickness managing unit 74 is greater than a second threshold cumulative thickness A2 of, for example, 5000 Å. Step S26 is executed if the response to the query in step S25 is negative. Step S29 is executed to carry out the purging process specified by the purging recipe 4 if the response to the query in step S25 is affirmative.

A query is made in step S26 to see if the cumulative thickness calculated by the film thickness managing unit 74 is greater than a first threshold cumulative thickness A1 of, for example, 1000 Å. The purging process specified by the purging recipe 2 is carried out in step S27 if the response to the query in step S26 is negative. The purging process specified by the purging recipe 3 is carried out in step S28 if the response to the query in step S26 is affirmative. After the purging process specified by the selected purging recipe has been completed, the next cycle of the film forming process is started in step S30.

Figure 10:
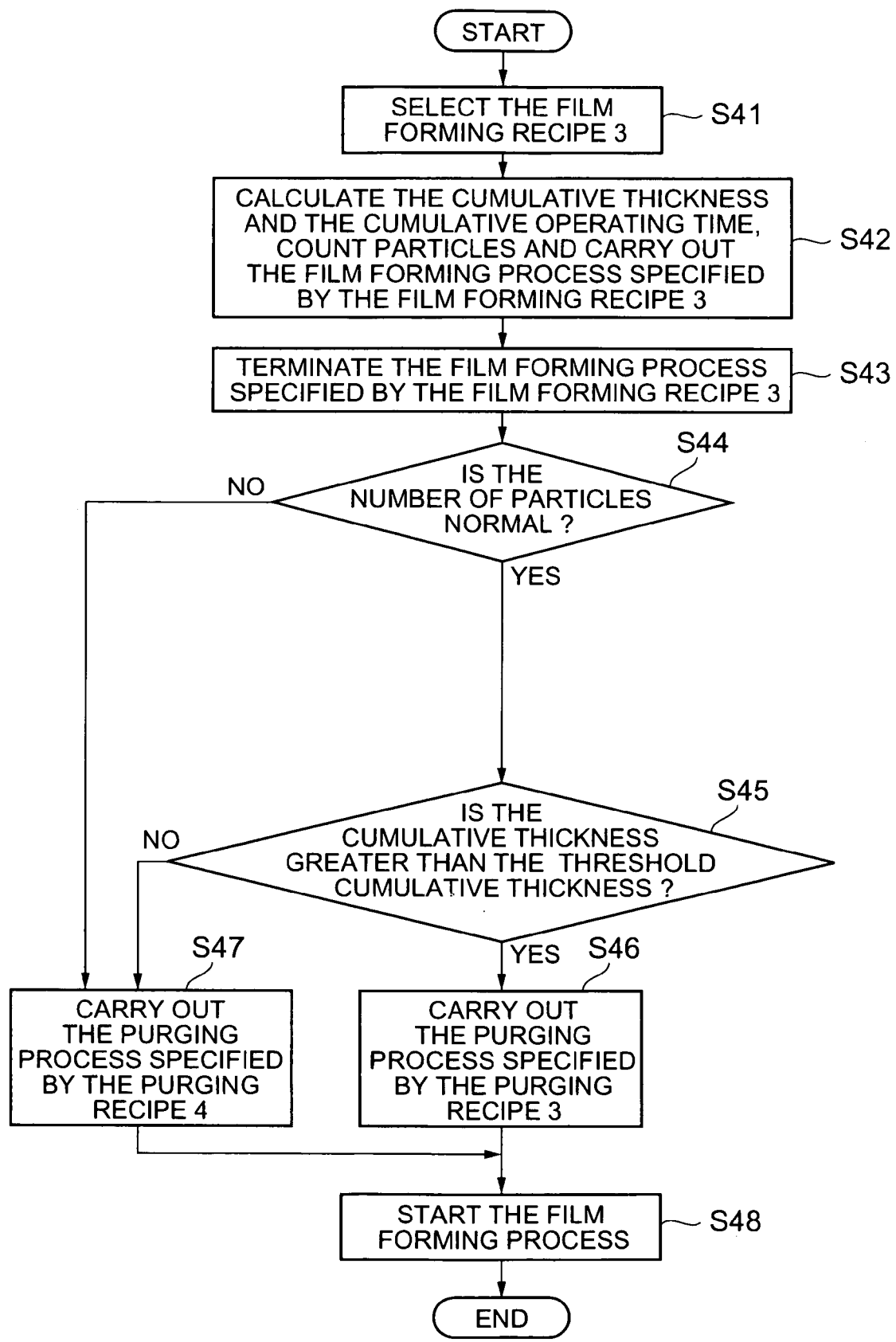
FIG. 10 is a flow chart of a process recipe 3 specifying conditions for a third process to be executed by the film forming system shown in FIG. 1.

The film forming method will be described with reference to a flow chart shown in FIG. 10 on an assumption that HCD gas is used as the film forming gas for forming a SiN film at a process temperature not lower than 500° C. The film forming recipe 3 is selected in step S41. The cumulative thickness and the cumulative operating time for which the reaction vessel 2 has been used are calculated, particles are counted and the film forming process specified by the film forming recipe 3 is carried out in step S42. HCD gas and $NH_3$ gas are used as film forming gases, the interior of the reaction vessel 2 is heated at a temperature in the range of 500° C. and 600° C. The film forming process specified by the film forming recipe 3 is terminated in step S43.

Subsequently a purging process is started. A query is made in step S44 to see if the number of particles is normal. Step S45 is executed if the response to the query in step S44 is affirmative. Step S47 is executed to carry out the purging process specified by the purging recipe 4 if the response to the query in step S44 is negative.

A query is made in step S45 to see if the cumulative thickness calculated by the film thickness managing unit 74 is greater than a threshold cumulative thickness A of, for example, 5000 Å. Step S46 is executed if the response to the query in step S45 is negative. Step S47 is executed to carry out the purging process specified by the purging recipe 4 if the response to the query in step S45 is affirmative. After the purging process specified by the selected purging recipe has been completed, the next cycle of the film forming process is started in step S48.

Figure 11:
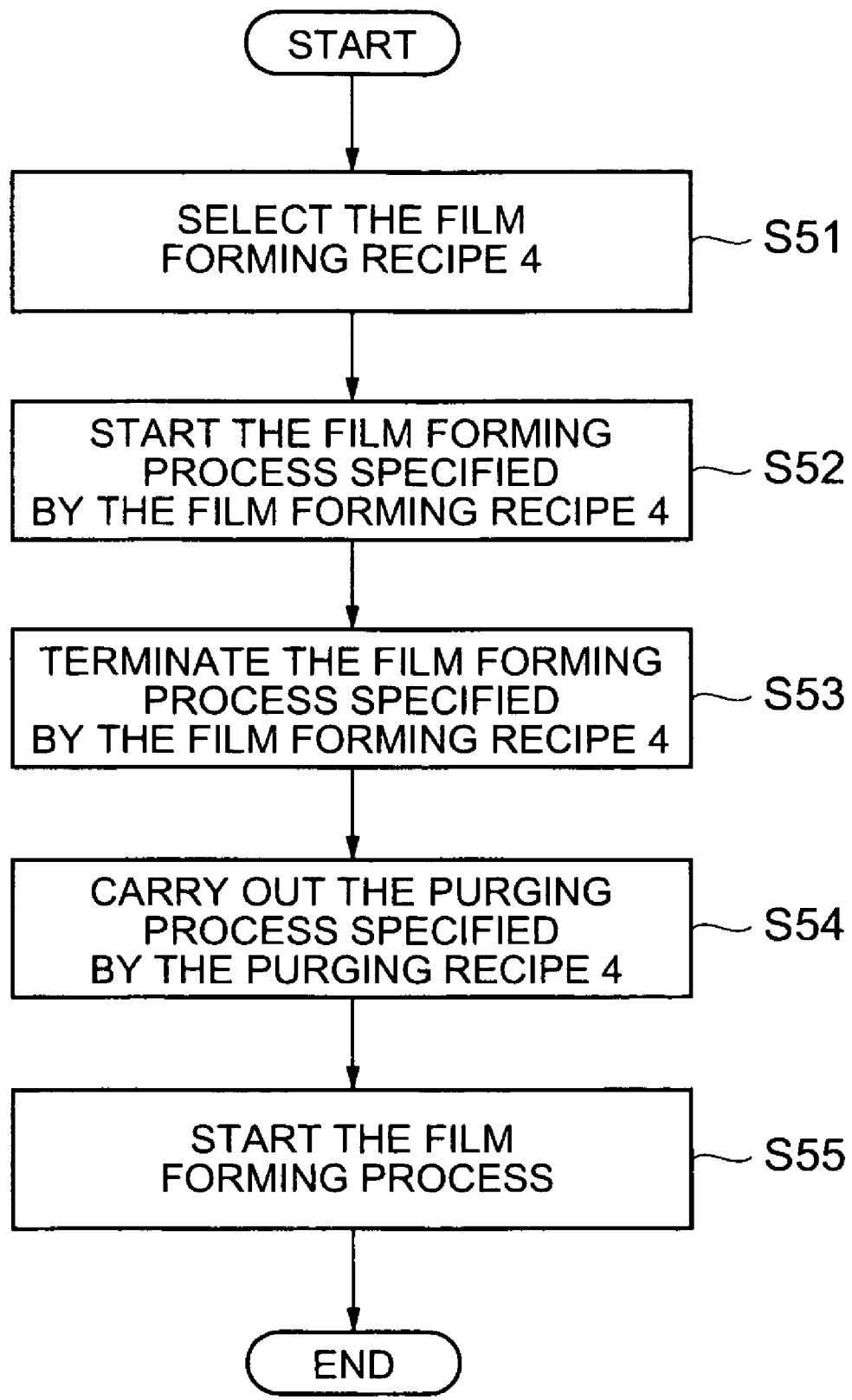
FIG. 11 is a flow chart of a process recipe 4 specifying conditions for a fourth process to be executed by the film forming system shown in FIG. 1.

The film forming method will be described with reference to a flow chart shown in FIG. 11 on an assumption that BTBAS gas is used as the film forming gas for forming a SiN film. The film forming recipe 4 is selected in step S51. The film forming process specified by the film forming recipe 4 is carried out in step S52. BTBAS gas and $NH_3$ gas are used as film forming gases and the interior of the reaction vessel 2 is heated at a temperature in the range of, for example 450° C. and 600° C. After the film forming process specified by the film forming recipe 4 has been terminated in step S53, the purging recipe 4 is selected and the purging process specified by the purging recipe 4 is carried out in step S54. After the purging process has been completed, the next cycle of the film forming process is started in step S55.

Figure 3:
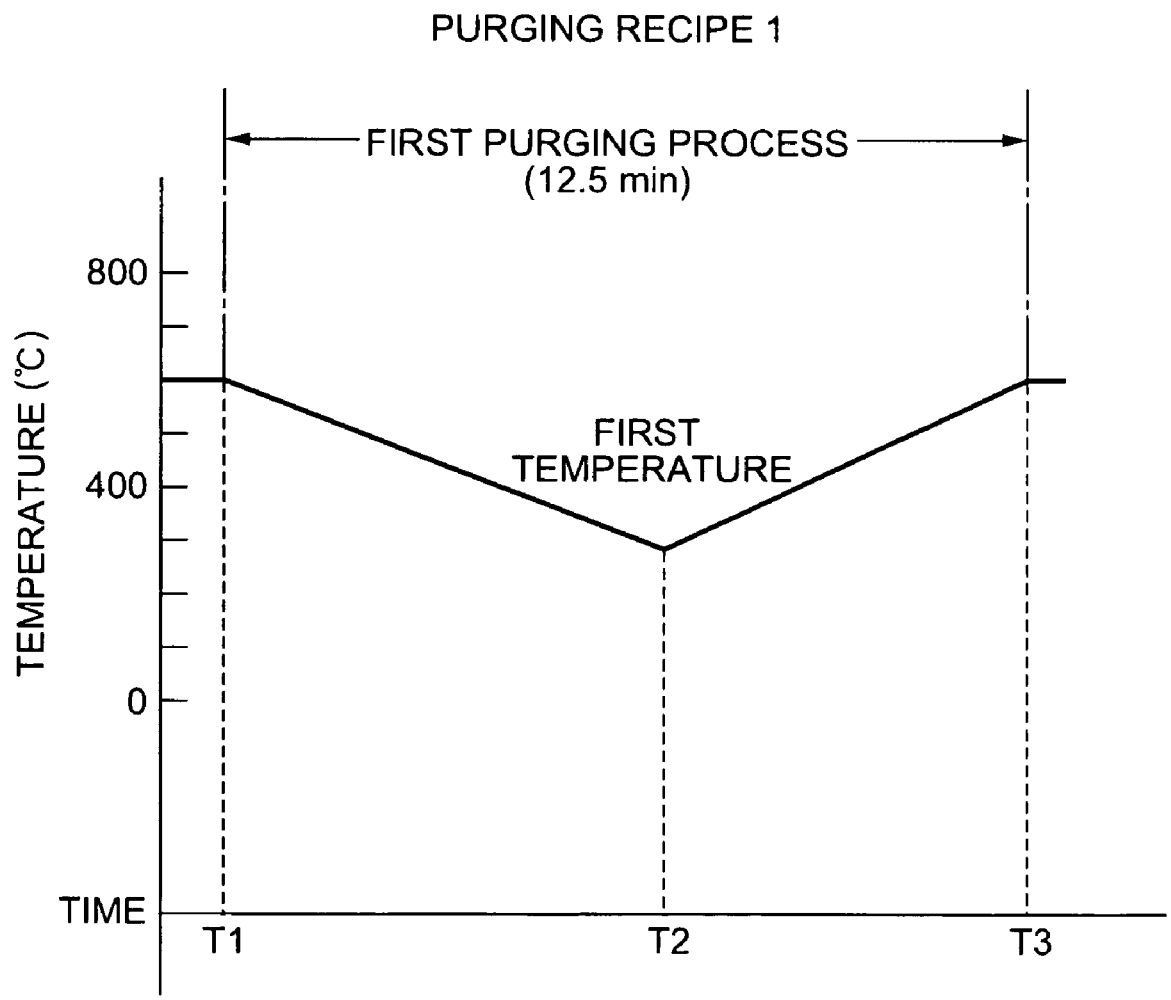
FIG. 3 is a diagram showing the characteristics of a purging recipe 1 specifying a purging process to be carried out by the film forming system shown in FIG. 1.

Those purging recipes will be described. Referring to FIG. 3, the purging process specified by the purging recipe 1 is started at time T1 when the wafer boat 25 is carried to the loading area 28 and the second lid 29 closes the open lower end 21 of the reaction vessel 2. Upon the start of the purging process, supply of power to the heater 51 is stopped and the reaction vessel 2 is cooled in a forced cooling mode by supplying cold air of, for example 0° C. through the air supply duct into the space between the reaction vessel 2 and the heating furnace 52 and discharging air from the space through the discharge line 57. Thus the reaction vessel 2 is cooled rapidly to a first temperature of, for example, 300° C. by time T2. Then, supply of the cold air is stopped and supply of power to the heater 51 is resumed to heat the reaction vessel 2, for example, at the temperature for the film forming process in the range of 650° C. to 760° C. by time T3. The first temperature and time T2 are determined such that the reaction vessel 2 is cooled rapidly at a cooling rate of, for example, 75° C./min so that the difference between the temperature of the reaction vessel 2 at the start of the purging process and that of the reaction vessel 2 at time T2 is in the range of about 100° C. to about 500° C.

Figure 12:
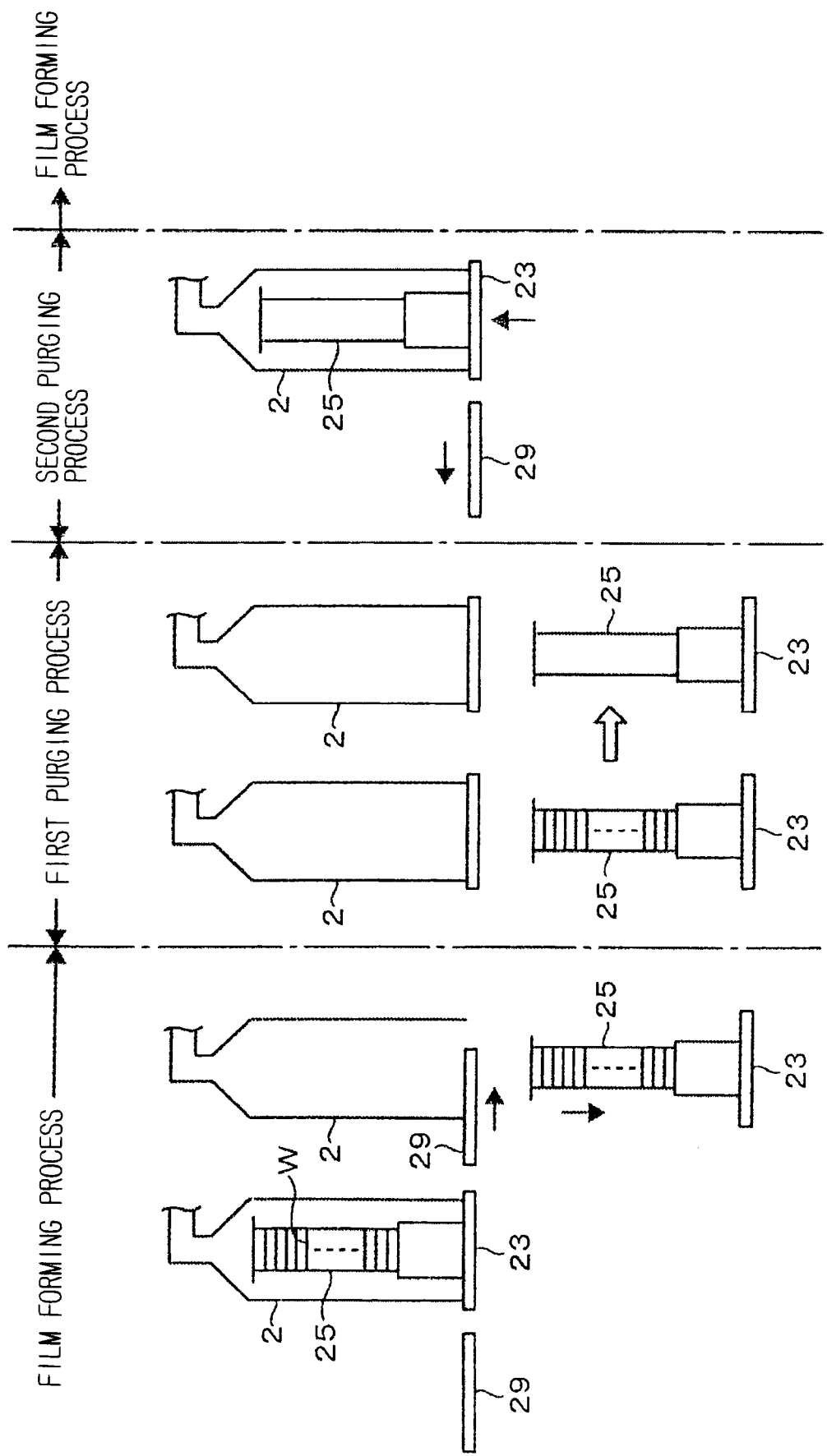
FIG. 12 is a pictorial view of assistance in explaining a first purging process and a second purging process to be executed by the film forming system shown in FIG. 1.

In a period between times T1 and T3, the purging gas is supplied from the purging gas source 37 through the gas supply pipe 32 into the reaction vessel 2 at a flow rate, for example, on the order of 30 slm, the main valve MV is closed, the needle valve NV is opened and the vacuum pump 41 is operated to discharge the atmosphere in the reaction vessel 2 through the by-pass line 46 at a discharge rate, for example, on the order of 30 l/min. The purging process specified by the purging recipe 1 is a first purging process that is carried out without placing the wafer boat 25 in the reaction vessel 2 as shown in FIG. 12. Process time needed for the first purging process is, for example, on the order of 12.5 min.

The purging recipe 1 is a basic recipe for the film forming process specified by the film forming recipe 1 specifying DCS gas as a film forming gas. Production of particles due to generation of gases and separation of films deposited on the inside surface of the reaction vessel 2 can be suppressed by carrying out the purging process specified by the purging recipe 1 after the completion of every cycle of the film forming process specified by the film forming recipe 1, provided that predetermined conditions are satisfied, i.e., provided that the number of particles is normal, the cumulative thickness is below the threshold cumulative thickness A and the cumulative operating time is below a limit cumulative operating time B.

When the reaction vessel 2 is cooled rapidly by forced cooling, films of a reaction main product and reaction by-products crack due to difference in heat capacity between those films and the reaction vessel 2 made of quartz.

When the atmosphere in the reaction vessel 2 is discharged at the discharge rate on the order of 30 l/min, surface parts of the deposited films that are about to come off are removed and are discharge outside the reaction vessel 2. Consequently, production of gases and particles due to the separation of the surface parts of the deposited films that are about to come off can be suppressed and the production of gases and particles in the film forming process following the purging process can be prevented. If undesired gasses are produced by the deposited films during the film forming process, the strength of adhesion of the deposited films to the inside surface of the reaction vessel is reduced and the deposited films are liable to come off the reaction vessel 2. Therefore, the production of gases needs to be suppressed.

The open lower end 21 of the reaction vessel 2 is closed by the second lid 29 during the purging process. Therefore, the wafer boat 25 held in the loading area 28 will not be contaminated with the films peed off the inside surface of the reaction vessel 2. Purging process time specified by the purging recipe 1 is 12.5 min, which is a reloading time necessary for unloading the processed wafers W from the wafer boat 25 and loading unprocessed wafers W on the wafer boat 25 in the loading area 28. Therefore, down time for which the film forming system is not operated does not increase because the purging process does not need any time for the purging process and the through put of the film forming system does not decrease when the purging process is carried out during the reloading time.

Figure 4:
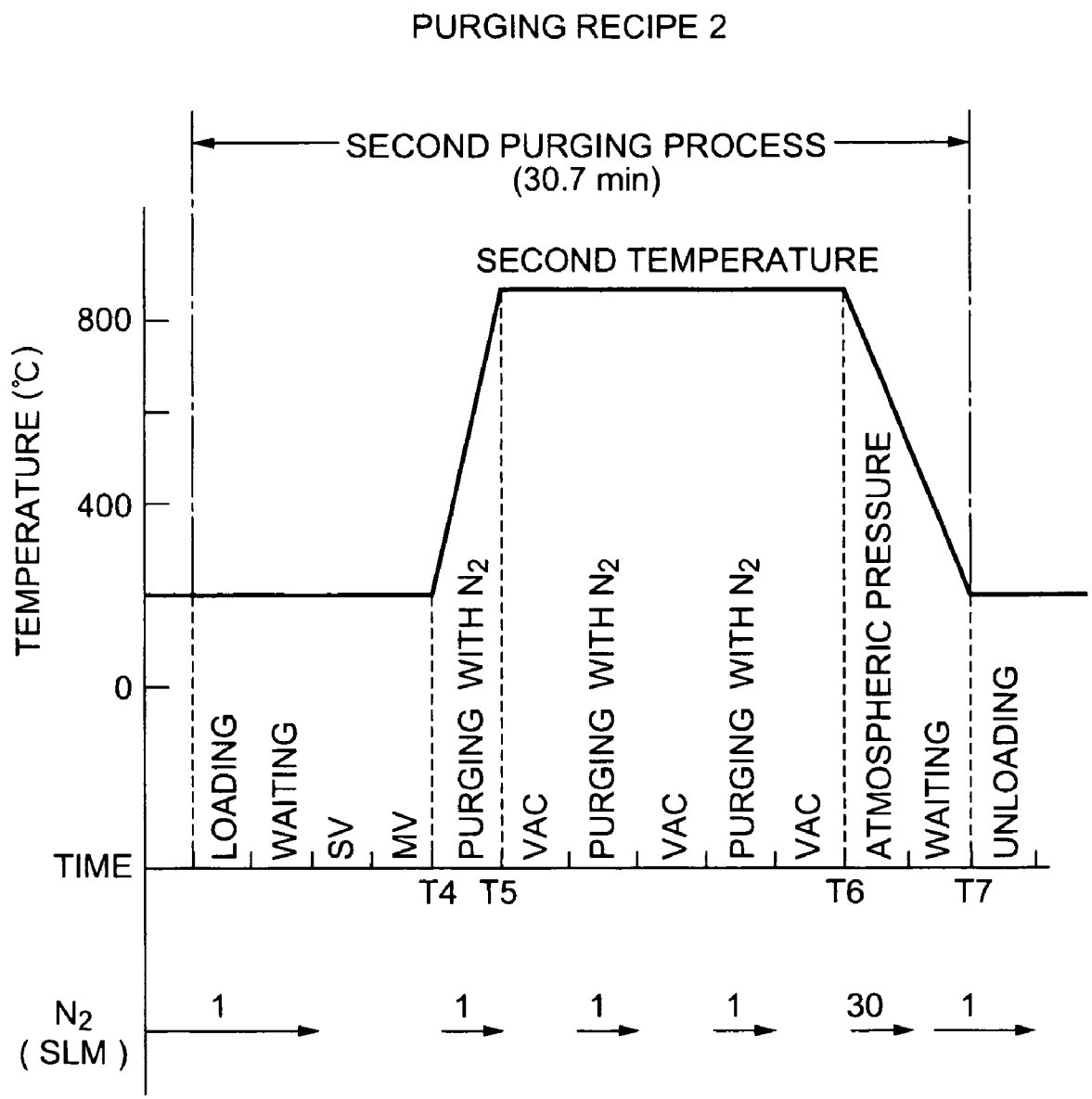
FIG. 4 is a diagram showing the characteristics of a purging recipe 2 specifying a purging process to be carried out by the film forming system shown in FIG. 1.

A purging process 2 specified by the purging recipe 2 will be described with reference to FIG. 4. The purging process 2 is carried out with the empty wafer boat 25 placed in the reaction vessel 2. The wafer boat 25 holding the processed wafers W is unloaded from the reaction vessel 2, the processed wafers are unloaded from the wafer boat 25, the empty wafer boat 25 is placed in the reaction vessel 2, and then the purging process 2 is started.

The purging process 2 is started when the open lower end 21 of the reaction vessel 2 is closed by the first lid 23 after the empty wafer boat 25 has been loaded into the reaction vessel 2. The temperature of the interior of the reaction vessel 2 when the empty wafer boat 25 is loaded into the reaction vessel 2 is, for example, equal to the temperature for the film forming process between 450° C. and a temperature below 500° C. In a waiting period subsequent to a period for loading the empty wafer boat 25 into the reaction vessel 2, $N_2$ is supplied from the purging gas source 37 through the gas supply pipe 32 into the reaction vessel 2 at a flow rate on the order of 1 slm.

Then, the reaction vessel 2 is evacuated. The vacuum pump 41 is operated and the needle valve NV is opened to discharge the atmosphere in the reaction vessel 2 through the by-pass line 46. Then, the main valve MV is opened to discharge the atmosphere in the reaction vessel 2 through the main line 45 to evacuate the reaction vessel to a vacuum on the order of 0.4 Pa. In this example, the pressure in the evacuated reaction vessel 2 is in the range of about 0.4 to about 1.0 Pa.

Supply of power to the heater 51 is started at time T4 to heat the interior of the reaction vessel 2 at a second temperature of, for example, 850° C. by time T5 during a purging cycle using $N_2$. Desirably, the second temperature is higher than a process temperature for the film forming process to be carried out after the purging process. Cooling the reaction vessel 2 is started at time T6 to cool the reaction vessel 2 to a temperature, for example, equal to the process temperature for the film forming process between 450° C. and a temperature below 500° C. by time T7.

In the purging cycle, $N_2$ is supplied from the purging gas source 37 through the gas supply pipe 32 into the reaction vessel 2 at a flow rate of 1 slm to purge the reaction vessel 2 of the atmosphere with $N_2$ ($N_2$ purging step), supply of $N_2$ is stopped, and then the vacuum pump 41 is operated to evacuate the reaction vessel 2 (VAC step). The vacuum pump 41 is operated and the main valve MV is opened to discharge the atmosphere in the reaction vessel 2 while $N_2$ gas is being supplied into the reaction vessel 2.

Purging and discharging are repeated alternately. Supply of $N_2$ is stopped after purging has been repeated three times, and then the main valve MV and the needle valve NV are closed and the vacuum pump 41 is stopped after discharging has been repeated three times. Then, $N_2$ is supplied from the purging gas source 37 into the reaction vessel 2 at a flow rate of 30 slm to adjust the pressure in the reaction vessel 2 to the atmospheric pressure. Then, $N_2$ is supplied from the purging gas source 37 into the reaction vessel 2 at 1 slm and the wafer boat 25 is unloaded from the reaction vessel to complete the purging process. The process time of the purging process is, for example, on the order of 30.7 min.

The purging process specified by the purging recipe 2 is effective in suppressing the production of particles caused by degassing and the resultant separation of the deposited film from the inside surface of the reaction vessel 2. The purging recipe 2 is a basic recipe specifying a film forming process using HCD gas specified by the film forming recipe 2 as a film forming gas and a temperature below 500° C. The foregoing predetermined conditions can suppress production of particles due to production of gases in the reaction vessel 2 and the resultant separation of the deposited films from the inside surface of the reaction vessel 2 by carrying out the purging process specified by the purging recipe 2 after the completion of every cycle of the film forming process specified by the film forming recipe 2.

Evacuation and heating at the second temperature of the reaction vessel are carried out simultaneously during the purging process to promote the separation of the deposited film from the inside surface of the reaction vessel 2 and the resultant production of gases by the difference in heat capacity between the reaction vessel 2 and the deposited films. Consequently, the remaining films are forced to produce gases. Heating the reaction vessel 2 at the second temperature higher than a process temperature for the following film forming process suppresses the production of gasses during the film forming process.

The purging process is carried out with the empty wafer boat 25 placed in the reaction vessel 2. Thus the films deposited on the wafer boat 25 can be removed to suppress production of particles and degassing of the residual films can be suppressed.

Figure 5:
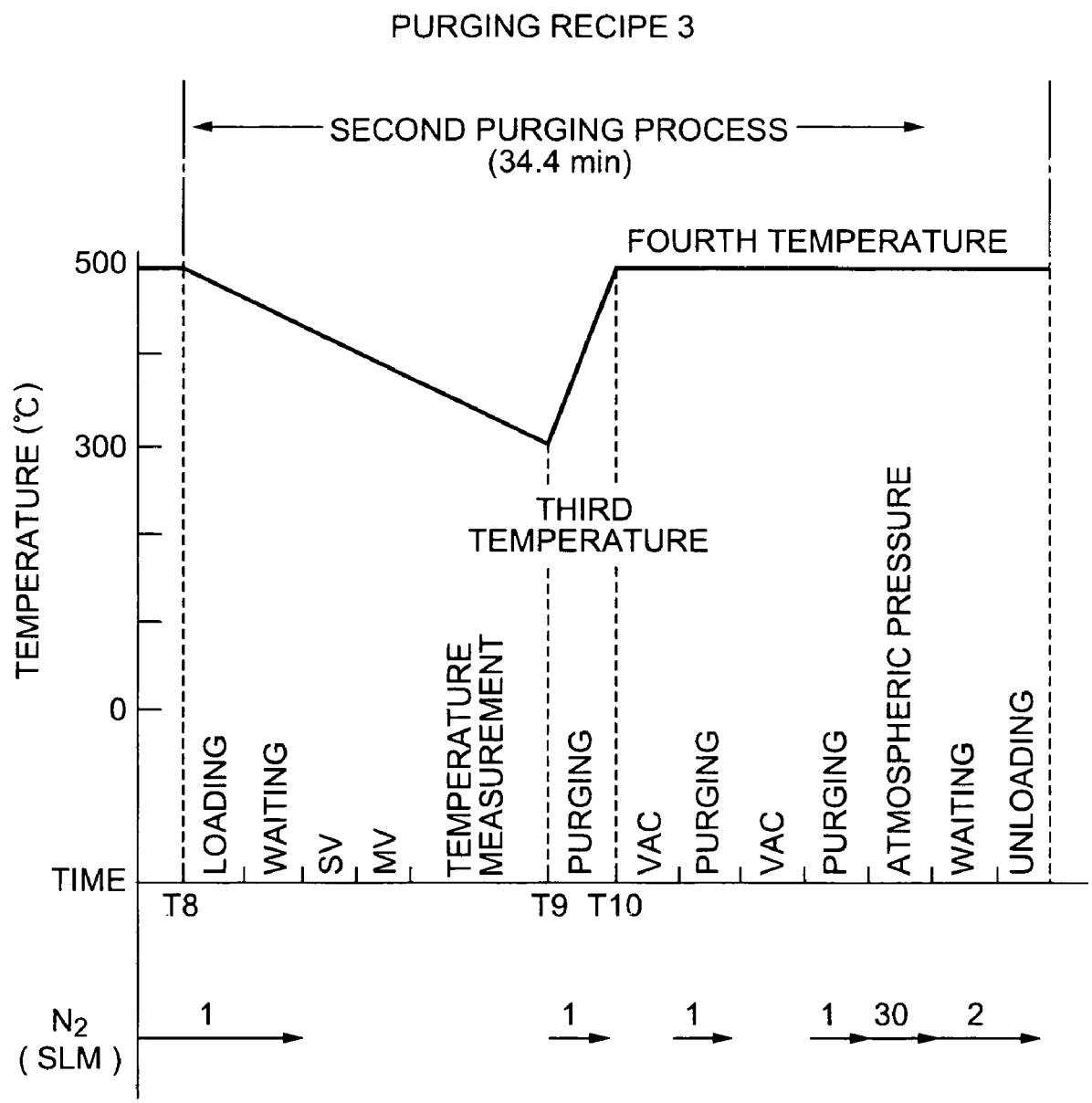
FIG. 5 is a diagram showing the characteristics of a purging recipe 3 specifying a purging process to be carried out by the film forming system shown in FIG. 1.

A purging process specified by the purging recipe 3 will be described with reference to FIG. 5. The purging process specified by the purging recipe 3 is similar to the purging process 2 specified by the purging recipe 2. The purging process is carried out with the empty wafer boat 25 placed in the reaction vessel 2. The wafer boat 25 holding the processed wafers W is unloaded from the reaction vessel 2, the processed wafers are unloaded from the wafer boat 25, the empty wafer boat 25 is placed in the reaction vessel 2, and then the purging process specified by the purging recipe 3 is started.

The purging process is started when the open lower end 21 of the reaction vessel 2 is closed by the first lid 23 after the empty wafer boat 25 has been loaded into the reaction vessel 2. In a waiting period subsequent to a period for loading the empty wafer boat 25 into the reaction vessel 2, $N_2$ is supplied from the purging gas source 37 through the gas supply pipe 32 into the reaction vessel 2 at a flow rate on the order of 1 slm.

Supply of power to the heater 51 is stopped at time T8 and the reaction vessel 2 is cooled in a forced cooling mode by supplying cold air of, for example 0° C. through the air supply duct into the space between the reaction vessel 2 and the heating furnace 52 and discharging air from the space through the discharge line 57. Thus the reaction vessel 2 is cooled rapidly to a third temperature of, for example, 300° C. by time T9. The third temperature is determined such that the difference between the temperature of the reaction vessel at the start of the purging process and that of the reaction vessel 2 at time T9 is in the range of about 100° C. to 500° C. Rapid cooling cools the reaction vessel 2 at a cooling rate of, for example, 75° C./min.

Then, the reaction vessel 2 is evacuated. The vacuum pump 41 is operated and the needle valve NV is opened to discharge the atmosphere in the reaction vessel 2 through the by-pass line 46. Then, the main valve MV is opened to discharge the atmosphere in the reaction vessel 2 through the main line 45 to evacuate the reaction vessel to a vacuum on the order of 0.4 Pa. In this example, the pressure in the evacuated reaction vessel 2 is in the range of about 0.4 to about 1.0 Pa.

Subsequently, supply of cold air is stopped and supply of power to the heater 51 is resumed after the interior of the reaction vessel 2 has been cooled to the third temperature by time T9. The reaction vessel 2 is heated so that the interior of the reaction vessel 2 is heated at a fourth temperature by time T10 and $N_2$ is supplied into the reaction vessel 2 for a purging cycle. Desirably, the fourth temperature is higher than a process temperature for the following film forming process to be carried out subsequently to the purging process. The interior of the reaction vessel 2 is maintained at the fourth temperature until the wafer boat 25 is unloaded from the reaction vessel 2.

The purging cycle supplies $N_2$ from the purging gas source 37 through the gas supply pipe 32 into the reaction vessel 2 at a flow rate of 1 slm ($N_2$ purging step), stops supplying $N_2$ into the reaction vessel 2, and then the reaction vessel 2 is evacuated by the vacuum pump 41 (VAC step). The main valve MV is opened during the $N_2$ purging step for evacuation using the vacuum pump 41. The $N_2$ purging step and the VAC step are repeated alternately. Nitrogen gas $N_2$ is supplied at 1 slm from the purging gas source 37 in the third cycle of the $N_2$ purging step. Then, supply of $N_2$ is stopped, the main valve MV and the needle valve NV are closed to stop evacuation using the vacuum pump 41, and $N_2$ is supplied from the purging gas source 37 at 30 slm to adjust the pressure of the interior of the reaction vessel 2 to the atmospheric pressure. Then, $N_2$ is supplied from the purging gas source 37 into the reaction vessel 2 at a flow rate of 2 slm and the wafer boat 25 is unloaded from the reaction vessel 2 to complete the purging process. The process time of the purging process is, for example, on the order of 34.4 min.

The purging recipe 3 is a basic recipe used for the film forming process that uses HCD gas specified by the film forming recipe 2 as the film forming gas and is carried out at a temperature in the range of 500° C. to 600° C. The foregoing predetermined conditions can suppress production of particles due to production of gases in the reaction vessel 2 and the resultant separation of the deposited films from the inside surface of the reaction vessel 2 by carrying out the purging process specified by the purging recipe 3 after the completion of every cycle of the film forming process specified by the film forming recipe 3.

The purging effect of the purging process specified by the purging recipe 3 is higher than those of the purging processes specified by the purging recipes 1 and 2, and the effect of the purging process specified by the purging recipe 3 in suppressing the production of gases and the resultant production of particles is higher than that of the purging process specified by the purging recipe 1. Therefore, the production of gases and particles during the film forming process specified by the film forming recipe 1 can be suppressed by carrying out the purging process specified by the purging recipe 3 even if the cumulative thickness is greater than a predetermined threshold cumulative thickness and the films deposited on the inside surface of the reaction vessel are cracked and ready to produced particles.

Since the effect of the purging recipe 3 in suppressing the production of particles is higher than that of the purging recipe 2, production of particles can be suppressed during the film forming process specified by the film forming recipe 2 by carrying out the purging process specified by the purging recipe 3 even if the cumulative thickness is greater than the first threshold cumulative thickness A1 of 1000 Å.

This purging process cools the reaction vessel 2 by forced air cooling to remove the surface layers, which are about to come off, of films of a main product and by-products that are deposited on the inside surface of the reaction vessel 2 and the discharges the removed surface layers of the films outside the reaction vessel 2 by discharging the atmosphere in the reaction vessel 2 by the vacuum pump 41. Evacuation of the reaction vessel 2 promotes the separation of the deposited films from the reaction vessel 2. The forced air cooling of the reaction vessel 2 during evacuation is more effective than the forced air cooling of the reaction vessel 2 at a normal pressure in removing the deposited film from the reaction vessel 2. Removal of the surface layers of the deposited film is effective in suppressing the production of particles due to the separation of the deposited films from the reaction vessel 2.

Surface layers of the films deposited on the inside surface of the reaction vessel 2 are made to become easy to peel off by evacuation and the difference in heat capacity between the films and the reaction vessel when the reaction vessel 2 is heated at the fourth temperature again during evacuation. The residual films remaining on the inside surface of the reaction vessel 2 after the surface layers have been removed are forced to produce gases. Heating the interior of the reaction vessel 2 at the fourth temperature higher than a process temperature for the film forming process following the purging process is effective in suppressing production of gases in the film forming process.

The purging process is carried out with the empty wafer boat 25 placed in the reaction vessel 2. Thus the films deposited on the wafer boat 25 can be removed to suppress production of particles and degassing of the residual films can be suppressed.

Figure 6:
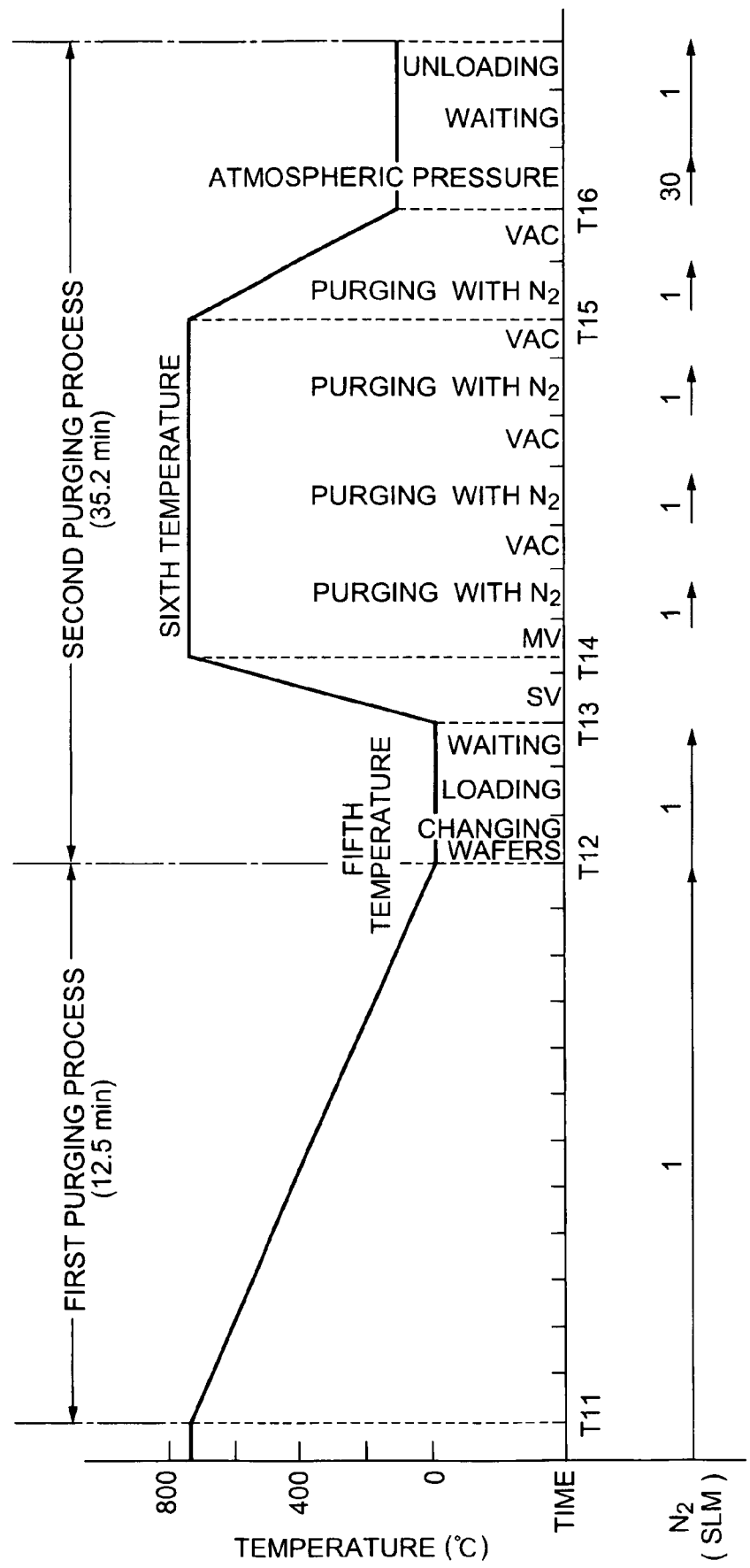
FIG. 6 is a diagram showing the characteristics of a purging recipe 4 specifying a purging process to be carried out by the film forming system shown in FIG. 1.

A purging process specified by the purging recipe 4 will be described with reference to FIG. 6. The purging recipe 4 corresponds to a conventional purging recipe. The purging process specified by the purging recipe 4 includes the first purging process and the second purging process which are carried out successively. The wafer boat 25 is unloaded from the reaction vessel 2 and is carried to the unloading area 28, the open lower end 21 of the reaction vessel 2 is closed by the second lid 29, and then the purging process specified by the purging recipe 4 is started. Supply of power to the heater 51 is stopped at time T11 and the reaction vessel 2 is cooled in a forced cooling mode by supplying cold air of, for example 0° C. through the air supply duct 53 into the space between the reaction vessel 2 and the heating furnace 52 and discharging air from the space through the discharge line 57. The difference between the fifth temperature and the temperature of the reaction vessel 2 at the start of the purging process is in the range of about 100° C. to about 500°. A cooling mode in which the reaction vessel 2 is cooled rapidly at a cooling rate of, for example, 75° C./min is called a rapid cooling mode.

In a period between times T11 and T12, $N_2$ is supplied from the purging gas source 37 through the gas supply pipe 32 into the reaction vessel 2 at a flow rate on the order of 1 slm, the main valve MV is closed, the needle valve NV is opened and the vacuum pump 41 is operated to discharge the atmosphere in the reaction vessel 2 at a discharge rate on the order of 30 l/min through the by-pass line 46. The first purging process is completed at time T12. The process time of the first purging process is, for example, about 12.5 min.

Then, the wafer boat 25 is loaded into the reaction vessel 2, the open lower end 21 of the reaction vessel 2 is closed by the first lid 23, and then the second purging process is started. In FIG. 6, a mounting step is placed before a loading step. However, since wafers W are not mounted on the wafer boat 25, the time for the mounting step is zero second. In a period between the loading step and a waiting step, $N_2$ is supplied from the purging gas source 37 into the reaction vessel 2 at a flow rate on the order of 1 slm. Supply of power t the heater 51 is started at time T13 to heat the interior of the reaction vessel 2 at a sixth temperature of, for example, 750° C. by time T14. Desirably, the sixth temperature is higher than a process temperature for the following film forming process. The interior of the reaction vessel 2 is kept at the sixth temperature for a predetermined time. At time T15, cooling of the reaction vessel 2 is started to decrease the temperature of the interior of the reaction vessel 2 to a temperature equal to or lower than a process temperature for the following film forming process.

After the wafer boat 25 has been loaded into the reaction vessel 2, the needle valve NV is opened and the vacuum pump 41 is operated to discharge the atmosphere in the reaction vessel 2 through the by-pass line 46. Then, the main valve MV is opened to discharge the atmosphere in the reaction vessel 2 through the main line 45 to crate a vacuum on the order of 0.4 Pa in the reaction vessel 2. The pressure in the evacuated reaction vessel 2 is in the range of 0.4 to 1.0 Pa.

After a predetermined vacuum has been created in the reaction vessel 2, a purging cycle using $N_2$ is carried out. The purging gas source 37 supplies $N_2$ at a flow rate of 1 slm ($N_2$ purging step), supply of $N_2$ is stopped and the reaction vessel 2 is evacuated by the vacuum pump 41 (VAC step). The main valve MV is opened and the vacuum pump 41 is operated for evacuation during the $N_2$ purging step. Supply of $N_2$ is stopped after the completion of the fourth cycle of the $N_2$ purging step. The main valve MV and the needle valve NV are closed to stop evacuation using the vacuum pump 41, and $N_2$ is supplied from the purging gas source 37 at 30 slm to adjust the pressure of the interior of the reaction vessel 2 to the atmospheric pressure. Then, $N_2$ is supplied from the purging gas source 37 into the reaction vessel 2 at a flow rate of 1 slm and the wafer boat 25 is unloaded from the reaction vessel 2 to complete the purging process. The process time of the purging process is, for example, on the order of 35.2 min.

The purging recipe 4 is a basic recipe used for the film forming process that uses BTBAS gas specified by the film forming recipe 4 as the film forming gas. Production of particles due to production of gases in the reaction vessel 2 and the resultant separation of the deposited films from the inside surface of the reaction vessel 2 can be suppressed by carrying out the purging process specified by the purging recipe 4 after the completion of every cycle of the film forming process specified by the film forming recipe 4.

The effect of the purging process specified by the purging recipe 4 in suppressing production of gases and particles is higher than those of the purging processes specified by the purging recipes 1, 2 and 3. Therefore, the purging process specified by the purging recipe 4 can suppress the production of gases and particles in the film forming process specified by the film forming recipes 1, 2 or 3 even if the cumulative thickness is greater than the threshold cumulative thickness A in the film forming process specified by the film forming recipe 2, even if the cumulative thickness is greater than the second threshold cumulative thickness A2).

The reaction vessel is cooled by force air cooling at an initial stage of the purging process specified by the purging recipe 4. As mentioned above, when the reaction vessel 2 is cooled by forced air cooling, surface layers, which are about to come off, of films a main products and by-products deposited on the inside surface of the reaction vessel 2 come off the inside surface of the reaction vessel 2 and are discharged outside the reaction vessel 2 together with the atmosphere in the reaction vessel discharged through the by-pass line 46 by the vacuum pump 41.

The interior of the reaction vessel 2 is heated up to a sixth temperature while the reaction vessel 2 is being evacuated to promote the separation of the deposited film from the inside surface of the reaction vessel 2 and the resultant production of gases by the difference in heat capacity between the reaction vessel 2 and the deposited films. Consequently, the remaining films become easy to produce gases and the residual films are forced to produce gases. Heating the reaction vessel 2 at the sixth temperature higher than a process temperature for the following film forming process can suppress the production of gasses during the following film forming process.

The second purging process is carried out with the empty wafer boat 25 placed in the reaction vessel 2. Thus the films deposited on the wafer boat 25 can be removed to suppress production of particles and degassing of the residual films can be suppressed. The first purging process is carried out without placing the wafer boat 25 in the reaction vessel 2. When the wafer boat 25 is unloaded from the reaction vessel 2, the wafer boat can be cooled in a natural cooling mode. The effect of the natural cooling mode is equal to or higher than the forced air cooling mode. Consequently, the separation of the deposited films can be promoted.

Operations of a series of processes, namely, the film forming process specified by a predetermined film forming recipe and the purging process specified by the predetermined purging recipe, are controlled by the controller 7 on the basis of the software stored in the controller 7.

The inventors of the present invention made studies and found that surface parts, which produces gases and particles, of films deposited on the inside surface of a reaction vessel can be removed and thereby the production of gases and particles in the following film forming process can be suppressed by carrying out a purging process having a purging effect compatible with a film forming process specified by a film forming recipe. The present invention has been made on the basis of the findings found through the studies. The inventors of the present invention analyzed causes of production of particles in each film forming process, produced purging recipes specifying purging processes respectively compatible with forming processes specified by film forming recipes through a trial-and-error method to accomplish the present invention.

The present invention prepares purging recipes specifying purging processes having effects compatible with film forming processes specified by film forming recipes, respectively, selects automatically a purging recipe specifying a purging process compatible with a film forming process when each cycle of the film forming process is completed, and processes the reaction vessel by the purging process specified by the selected purging recipe. Some of the film forming processes require a purging process having a strong purging effect and the others require a purging process having a moderate purging effect. The process time of the purging process having a strong purging effect is long.

More concretely, the present invention prepares the four purging recipes respectively specifying purging processes respectively having different purging effects, namely, the purging recipe 1 specifying the purging process having the shortest process time of 12.5 min and not causing any downtime, the purging recipe 2 specifying the purging process having a process time of about 30.7 min, causing a downtime equal to the process time and having a purging effect higher than that of the purging process specified by the purging recipe 1, the purging recipe 3 specifying the purging process having a process time of about 34.4 min, causing a downtime equal to the process time and having a purging effect higher than those of the purging processes specified by the purging recipes 1 and 2, and the purging recipe 4 specifying the purging process having a process time of 47.7 min causing a downtime of about 35.2 min and having a purging effect higher than those of the purging processes specified by the purging recipes 1, 2 and 3.

The purging process having a purging effect compatible with the film forming process can remove the films that are deposited on the inside surface of the reaction vessel and produce gases and particles, avoiding spending time on useless purging process, such as spending the long process time of the purging process specified by the purging recipe 4 after the film forming process using DCS gas as a film forming gas. Thus downtime during which the film forming system is not operating to carry out the film forming process can be removed or reduce to the shortest possible time and, consequently, the reduction of through put due to the purging process can be suppressed.

The inventors of the present invention found that different cumulative thicknesses of the films deposited on the inside surface of the reaction vessel 2, different operating times of the reaction vessel 2 and different numbers of particles in the loading area 28 and the discharge pipe 43 require different purging recipes suitable for suppressing the production of gases and particles. In such a case, the purging recipe is changed automatically for a suitable purging recipe compatible with the condition of the reaction vessel 2. Consequently, the films deposited on the inside surface of the reaction vessel and causing the production of gases and particles can be surely removed after the every cycle of the film forming process.

More concretely, the film deposited on the inside surface of the reaction vessel 2 is liable to produce gases, to crack and to come off when the cumulative thickness of the films deposited on the inside surface of the reaction vessel 2 is greater than the threshold cumulative thickness A. Therefore, the purging process specified by the purging recipe 4 and having the highest purging effect is carried out to remove the film deposited on the inside surface of the reaction vessel 2 completely when the cumulative thickness is greater than the threshold cumulative thickness A. When the cumulative thickness increases excessively, the films deposited on the inside surface of the reaction vessel 2 become easy to come off. Therefore, in such a case, the purging process specified by the purging recipe 4 and having the highest purging effect is carried out when the number of particles in the loading area 28 or the discharge pipe 43 increases suddenly.

The amount of gases produced by the deposited films increase, the deposited films on the inside surface of the quartz reaction vessel 2 crack and particles are produced when the cumulative operating time increases excessively. In such a case, a purging process having a purging effect higher than that of the basic purging process specified by the basic purging recipe may be carried out.

It is effective to select a purging recipe other than the basic purging recipe on the basis of the cumulative thickness of the films formed in the reaction vessel 2, the cumulative operating time of the reaction vessel 2, the number of particles in the discharge pipe 43 and the number of particles adhering to the surfaces of the wafers W and to carry out a purging process specified by the selected purging recipe. However, such a purging recipe does not need necessarily to be selected and a purging process specified by a basic purging recipe compatible with the film forming recipe may be carried out. A purging recipe other than the basic purging recipe may be selected on the basis of one or two of conditions including the cumulative thickness of the films formed in the reaction vessel 2, the cumulative operating time of the reaction vessel 2, the number of particles in the discharge pipe 43 and the number of particles adhering to the surfaces of the wafers W. and a purging process specified by the selected purging recipe may be carried out. Particles in the reaction vessel 2 may be measured in addition to those in the discharge pipe 43. Particles adhering to the surfaces of the wafers W may be measured either in or outside the reaction vessel 2.

The present invention is applicable not only to the film forming process for forming SiN films, but also to film forming processes respectively for forming TaN films, TiN films and WN films. The film forming process is not limited to a film forming process for forming films of the same type and may be a film forming process for forming films of different types.

Degassing occurs when HCD gas is used as a film forming gas, the film forming process specified by the film forming recipe 2 specifying a process temperature below 500° C., such as 450° C. and the film forming process specified by the film forming recipe 3 specifying a process temperature not lower than 500° C., such as 600° C. are carried out successively, and the film forming process specified by the film forming recipe 3 is carried out after the purging process specified by the basic purging recipe 2 compatible with the film forming recipe 2 even if the cumulative thickness after the film forming process specified by the film forming recipe 2 is smaller than the threshold cumulative thickness A1. Therefore, in such a case, it is preferable to carry out the purging process specified by the purging recipe 3 or 4 having a purging effect higher than that of the purging process specified by the purging recipe 2.

A second embodiment of the present invention will be described. The second embodiment is analogous with the first embodiment, except that the second embodiment uses $NH_3$ gas instead of $N_2$ as a purging gas. The description of the second embodiment will be made with reference to FIGS. 1 to 12, in which $N_2$, namely, the purging gas, is replaced with $NH_3$ gas, and $NH_3$ gas, namely, a purging gas, is supplied from the film forming gas source 36 that supplies $NH_3$ gas as a film forming gas.

The film forming process specified by the film forming recipe 1 forms a SiN film on the surface of the wafer W by using DCS gas and $NH_3$ gas. The film forming processes specified by the film forming recipes 2 and 3 form a SiN film on the surface of the wafer W by using HCD gas and $NH_3$ gas. Therefore, in the film forming processes for forming the SiN film, Cl atoms contained in the DCS gas and the HCD gas penetrate into the SiN film. Consequently, surface parts of the SiN films deposited on the inside surface of the reaction vessel 2 and the wafer boat 25 emit Cl atoms when the surface parts of the SiN films are caused to come off due to the forced air cooling or heating of the reaction vessel 2 during the purging process specified by, for example, the purging recipe 1 or 3. The Cl atoms emitted by the surface parts of the deposited SiN films adhere to the inside surface of the reaction vessel 2 and the wafer boat 25. The Cl atoms adhering to the inside surface of the reaction vessel 2 and the wafer boat 25 scatter and adhere to the surfaces of wafers W when the wafer boat 25 holding the wafers W is loaded into the reaction vessel 2 and the next film forming process is carried out. When SiN films are formed on the surfaces of the wafers W, respectively, by using, for example, DCS gas and $NH_3$ gas after thus loading the wafer boat 25 into the reaction vessel 2, the Cl atoms adhering to the surfaces of the wafers W delay the formation of the SiN films by an incubation time; any films are not formed upon the supply of the film forming gases onto the surfaces of the wafers W and the film starts rapidly growing on the surfaces of the wafers W after a certain time has elapsed since the supply of the film forming gases onto the surfaces of the wafers W. Consequently, the SiN films thus formed have irregular, rough surfaces and irregular thickness. Such SiN films are inferior in electrical characteristics and etch characteristics.

When $NH_3$ gas is used as a purging gas instead of $N_2$ in the purging processes (cycle purging) specified by the purging recipes 1 to 4, the Cl atoms contained in the surface parts of the SiN films and $NH_3$ gas interact and $NH_4Cl$ (ammonium chloride) is produced. Then, $NH_4Cl$ is discharged from the reaction vessel 2.

This film forming method has an effect of preventing the deterioration of, for example, the electrical and etching characteristics of the SiN films formed on the surfaces of wafers W after the reaction vessel 2 has been processed by the purging process in addition to those of the film forming method using $N_2$ as a purging gas.

The purging method using $NH_3$ gas as a purging gas is applicable not only to a method that selects a purging recipe automatically on the basis of the cumulative thickness of films formed by a film forming process specified by a selected film forming recipe, but also to a method that purges the empty reaction vessel 2 not holding any wafers therein. This purging method can be applied to, for example, a method that purges the reaction vessel 2 by a purging process after the wafer boat 25 holding processed wafers processed by a film forming process has been unloaded from the reaction vessel 2 and the reaction vessel has been sealed, such as a method that processes the reaction vessel 2 by a purging process that supplies $NH_3$ gas as a purging gas into the reaction vessel 2 while the reaction vessel 2 is being cooled by forced cooling, and a method that cools the reaction vessel 2 loaded with or not loaded with the wafer boat 25 by forced cooling or heating the interior of the reaction vessel 2 at a temperature higher than the process temperature of the film forming process by rapid heating and processes the reaction vessel by a purging process. The purging gas is not limited to pure $NH_3$ gas. The purging gas may be a mixed gas prepared by mixing $NH_3$ gas and a diluting gas, such as $N_2$.

This purging method is effective when a film forming gas containing chlorine, such as a chlorine compound gas or chlorine gas, is used as a film forming gas. Therefore, the purging method is applicable to a purging process that is to be carried out after a Ti film forming process using, for example, $TiCl_4$ gas (titanium tetrachloride gas).

A third embodiment of the present invention will be described. The third embodiment is analogous with the first embodiment, except that the third embodiment uses Oxygen gas ($O_2$) or a mixed gas prepared by mixing $O_2$ and an inert gas, such as $N_2$ instead of $N_2$ as a purging gas. The description of the second embodiment will be made with reference to FIGS. 1 to 12, in which $N_2$, namely, the purging gas, is replaced with $O_2$, and $O_2$, namely, a purging gas, is supplied from an $O_2$ source, not shown.

SiN films adhering to the inside surface of the reaction vessel 2 and the wafer boat 25 are removed by cooling the reaction vessel 2 by forced cooling or heating the reaction vessel by the purging process specified by the purging recipe 1 or 3. The adhesion of SiN films to quartz is strong and, therefore, the SiN films adhering to the inside surface of the reaction vessel 2 made of quartz and the wafer boat 25 made of quartz are difficult to remove and the inside surface of the reaction vessel 2 made of quartz and the surface of the wafer boat 25 made of quartz are cracked when the SiN films are separated from them. It is inferred that the inside surface of the reaction vessel 2 and the surface of the wafer boat 25 are cracked because a high tensile stress is induced in the inside surface of the reaction vessel 2 and the wafer boat 25 when the SiN films are removed from the inside surface of the reaction vessel 2 and the wafer boat 25.

The purging processes (cycle purging) specified by the purging recipes 1 to 4 use, for example, $O_2$ as a purging gas instead of $N_2$. Thus a gas containing oxygen is used for purging the reaction vessel 2 to form a $SiO_2$ film on the SiN film to induce a compressive stress in the surfaces of the SiN film. Consequently, the tensile stress induced in the SiN film is reduced to prevent the separation of the residual, unstable SiN film remaining o the inside surface of the reaction vessel 2 and the surface of the wafer boat 25.

The third embodiment has an effect of oxidizing the unstable, residual SiN film remaining on the surfaces of the quartz members to prevent the unstable, residual SiN film from coming off the surfaces of the quartz members, to suppress the contamination of the wafers with the unstable SiN film that falls off the surfaces of the quartz members during the film forming process and to suppress the development of cracks in the surfaces of the quartz members in addition to the effect of the first embodiment using $N_2$ as a purging gas.

What is claimed is:

1. A film forming method of processing substrates by a film forming process using film forming gases by a thermal processing system provided with a plurality of film forming recipes, said film forming method comprising the steps of:
    processing substrates held on a substrate holder placed in a reaction vessel by a film forming process specified by a selected one of the film forming recipes;
    unloading the substrates from the reaction vessel;
    automatically selecting one of a plurality of previously prepared purging recipes on the basis of a cumulative thickness equal to the sum of thicknesses of thin films formed by cycles of the film forming process specified by the selected film forming recipe; and
    carrying out a purging process specified by the selected purging recipe to purge the reaction vessel by supplying a purging gas into the reaction vessel after the substrates have been unloaded from the reaction vessel.

2. The film forming method according to claim 1, wherein the plurality of film forming recipes include those respectively specifying different film forming gases to form thin films of the same type.

3. The film forming method according to claim 1, wherein the plurality of film forming recipes include those respectively specifying the same film forming gases and different process temperature ranges.

4. The film forming method according to claim 1, wherein the plurality of purging recipes include those differing from each other in at least either of purging time and temperature condition in the reaction vessel.

5. The film forming method according to claim 1, wherein the substrate holder holds a plurality of substrates in parallel layers, and the purging process includes a first purging process that is carried out in a state where the reaction vessel is sealed after the substrate holder has been unloaded from the reaction vessel.

6. The film forming method according to claim 1, wherein the substrate holder holds a plurality of substrates in parallel layers, and the purging process includes a second purging process that is carried out in a state where the empty substrate holder is placed in the sealed reaction vessel.

7. The film forming method according to claim 1 further comprising the step of changing the purging recipe on the basis of at least either of the measured number of particles in the reaction vessel and the measured number of particles adhering to the surfaces of the substrates.

8. The film forming method according to claim 1, wherein the first and/or the second pursing process includes the step of forcibly cooling the reaction vessel.

9. The film forming method according to claim 1, wherein the second purging process includes the step of heating the reaction vessel at a temperature higher than a process temperature for a film forming process following the purging process.

* * * * *